US012720929B2

(12) United States Patent
Choi et al.

(10) Patent No.: US 12,720,929 B2

(45) Date of Patent: Aug. 25, 2026

(54) DISPLAY DEVICE

(71) Applicant: Samsung Display Co., LTD., Yongin-si (KR)

(72) Inventors: Jin Woo Choi, Yongin-si (KR); Sung Kook Park, Yongin-si (KR); Sung Eun Baek, Yongin-si (KR); Dae Ho Song, Yongin-si (KR); Hyung Il Jeon, Yongin-si (KR); Byeong Hwa Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 791 days.

(21) Appl. No.: 17/854,550

(22) Filed: Jun. 30, 2022

(65) Prior Publication Data

US 2023/0146518 A1 May 11, 2023

(30) Foreign Application Priority Data

Nov. 5, 2021 (KR) ........................ 10-2021-0151388

(51) Int. Cl.

*H10H 20/851* (2025.01)
*H10H 20/814* (2025.01)
*H10H 20/831* (2025.01)

(52) U.S. Cl.

CPC ...... *H10H 20/8514* (2025.01); *H10H 20/814* (2025.01); *H10H 20/8312* (2025.01)

(58) Field of Classification Search

CPC ............. H10H 20/8514; H10H 20/814; H10H 20/8312; H10H 20/841; H10H 20/8513; H10H 20/851; H10H 20/852; H10H 20/855; H01L 25/167; H01L 25/0753; H10D 86/40; H10W 90/00

See application file for complete search history.

(56) References Cited

U.S. PATENT DOCUMENTS 7,812,809 B2 10/2010 Choi et al.
7,852,547 B2 12/2010 Kim
10,349,488 B2 7/2019 Black et al.
10,902,800 B2 1/2021 Wu et al.
2015/0261076 A1* 9/2015 Dijken ................. G02B 26/008 977/774
2019/0157323 A1* 5/2019 Ogi ..................... H10F 39/8057
2020/0044128 A1* 2/2020 Miki .................... H10H 20/857
2022/0059722 A1* 2/2022 Goshonoo ............ H10H 20/813
2022/0069178 A1* 3/2022 Do ....................... H10H 20/853
2022/0069182 A1* 3/2022 Iguchi ................... H01L 25/167
2022/0165921 A1 5/2022 Choi et al.

(Continued)

FOREIGN PATENT DOCUMENTS

CN 102681164 9/2012
JP 2016-105122 6/2016
KR 100686081 B1 2/2007

(Continued)

*Primary Examiner* — Fernando L Toledo
*Assistant Examiner* — Marshall Mu-Nuo Hatfield
(74) *Attorney, Agent, or Firm* — CANTOR COLBURN LLP

(57) ABSTRACT

A display device includes bank patterns disposed on a substrate, a light emitting element disposed between the bank patterns on the substrate, and a color wheel disposed on the light emitting element. The light emitting element and the bank patterns include a same material.

16 Claims, 13 Drawing Sheets

(56) References Cited

U.S. PATENT DOCUMENTS

2022/0392949 A1 * 12/2022 Cai .................... H10H 29/142

FOREIGN PATENT DOCUMENTS

| | | |
|---|---|---|
| KR | 10-2007-0081736 | 8/2007 |
| KR | 10-1129435 | 3/2012 |
| KR | 10-2018-0030878 | 3/2018 |
| KR | 10-2209200 | 1/2021 |
| KR | 10-2022-0070141 | 5/2022 |

* cited by examiner

FIG. 11
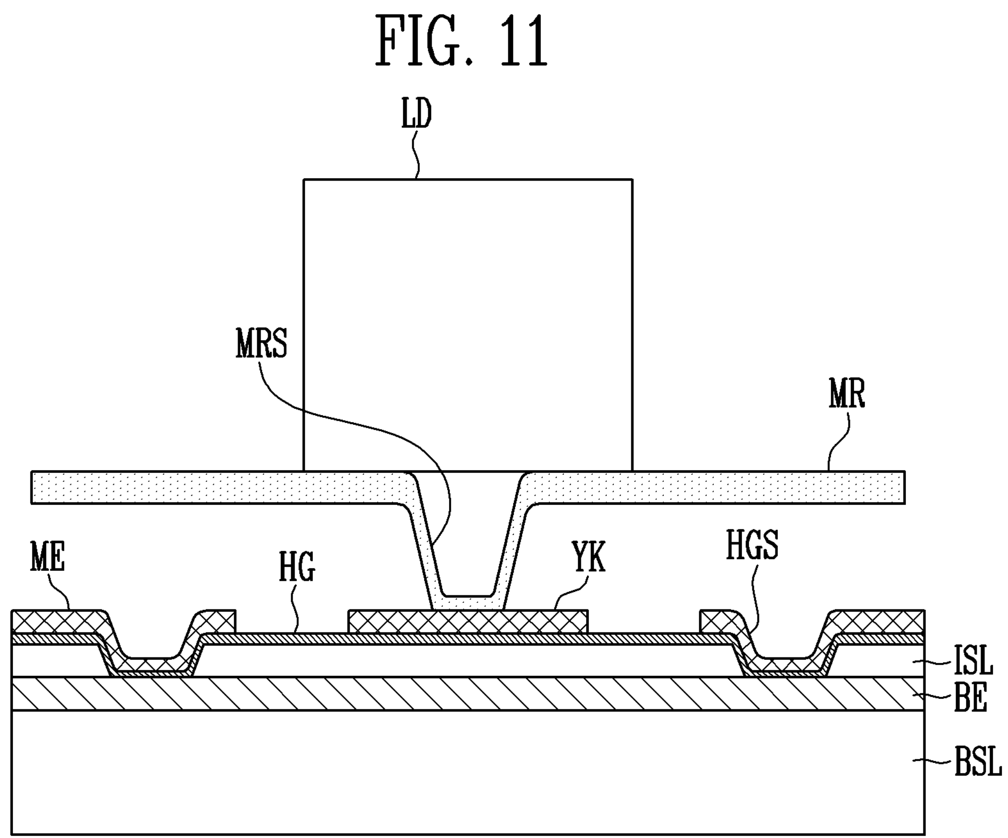
FIG. 12
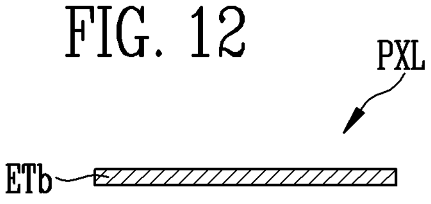
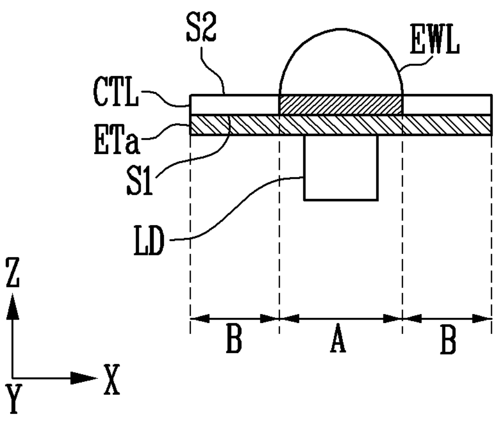

PXL1
PXL2
PXL3
EWL1
EWL2
EWL3
ETb
CTL
ETa'
LD
B1
A1
B1
B2
A2
B2
A3
Z
Y
X
A
A1
A2
A3
B
B1
B2
B3

DISPLAY DEVICE

CROSS-REFERENCE TO RELATED APPLICATION(S)

This application claims priority to and the benefit of Korean Patent Application No. 10-2021-0151388 under 35 U.S.C. § 119, filed in the Korean Intellectual Property Office (KIPO) on Nov. 5, 2021, the entire contents of which are incorporated herein by reference.

BACKGROUND

1. Technical Field

The disclosure relates to a display device.

2. Description of the Related Art

Recently, as interest in information display increases, research and development for display devices is continuously conducted.

SUMMARY

The disclosure has been made in an effort to provide a display device that may simplify a manufacturing process thereof.

The disclosure has been made in an effort to provide a stereoscopic image display device.

Aspects of the disclosure are not limited to the aspects mentioned above, and other aspects that are not mentioned may be clearly understood to a person of an ordinary skill in the art using the following description.

An embodiment provides a display device that may include bank patterns disposed on a substrate, a light emitting element disposed between the bank patterns on the substrate, and a color wheel disposed on the light emitting element. The light emitting element and the bank patterns may include a same material.

The color wheel may include a first color conversion area emitting a first color, a second color conversion area emitting a second color, and a third color conversion area emitting a third color.

The color wheel may be rotated so that one of the first color conversion area, the second color conversion area, and the third color conversion area may overlap the light emitting element in a plan view.

An area of each of the first color conversion area, the second color conversion area, and the third color conversion area may be larger than an area of the light emitting element.

The color wheel may include a partition, and a color conversion layer disposed in the partition.

The display device may further include a wheel rotation axis that drives the color wheel.

The light emitting element and each of the bank patterns may include a first semiconductor layer, a second semiconductor layer, and an active layer disposed between the first semiconductor layer and the second semiconductor layer.

The display device may further include a reflective layer disposed on side surfaces of the bank patterns.

Another embodiment provides a display device that may include an electrode disposed on a substrate, a mirror disposed on the electrode, a hinge disposed between the electrode and the mirror and adjusting an angle of the mirror, and a light emitting element coupled to the mirror.

The light emitting element may include a first semiconductor layer, a second semiconductor layer, and an active layer disposed between the first semiconductor layer and the second semiconductor layer.

The display device may further include a yoke disposed on the hinge and adjusting an angle of the mirror.

The display device may further include a mirror supporter physically connecting the mirror and the yoke.

The mirror and the mirror supporter may be integral with each other.

Another embodiment provides a display device that may include pixels, wherein each of the pixels may include a coating layer including a hydrophobic area and a hydrophilic area, an electrode disposed on a first surface of the coating layer, a light emitting element disposed on the electrode, and an electro-wetting lens disposed in the hydrophobic area on a second surface of the coating layer.

The pixels may include a first pixel, a second pixel, and a third pixel, and widths of the hydrophobic areas of the first to third pixels may be different from each other.

The electrode may include electrode patterns.

The display device may further include a bank including an opening overlapping the hydrophobic area in a plan view.

The electro-wetting lens may be disposed within the opening of the bank.

A width of the hydrophobic area of the coating layer may vary according to a voltage applied to the electrode.

The electro-wetting lens may overlap the light emitting element in a plan view.

Particularities of other embodiments are included in the detailed description and drawings.

According to an embodiment of the disclosure, it may be possible to simplify a manufacturing process by implementing a color of a pixel by using a color wheel.

According to another embodiment of the disclosure, it may be possible to implement a stereoscopic image display device by forming a light field by using a micro system or an electro-wetting lens.

Effects of embodiments of the disclosure are not limited by what is illustrated in the above, and additional various effects are included in the specification.

BRIEF DESCRIPTION OF THE DRAWINGS

FIG. 3 illustrates a schematic cross-sectional view of a light emitting substrate according to an embodiment.

FIG. 11 illustrates a schematic cross-sectional view of the micro system of FIG. 10.

FIG. 12 illustrates a schematic cross-sectional view of a pixel according to another embodiment.

DETAILED DESCRIPTION OF THE EMBODIMENTS

Figure 1:
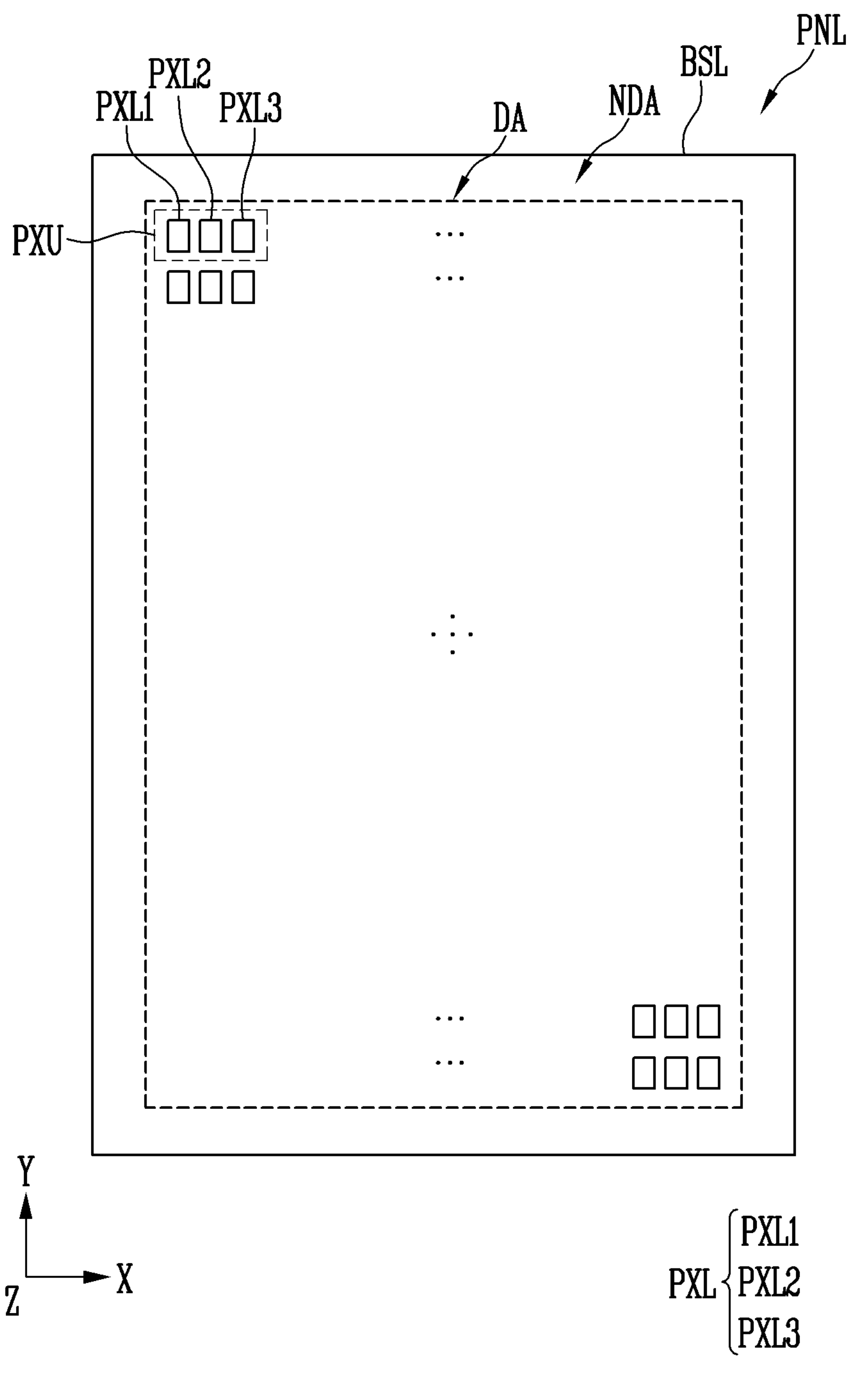
FIG. 1 illustrates a schematic top plan view of a display device according to an embodiment.

Advantages and features of the disclosure and methods of accomplishing the same may be understood more readily by reference to the following detailed description of embodiments and the accompanying drawings. The disclosure may, however, be embodied in different forms and should not be construed as limited to the embodiments set forth herein. The embodiments are provided so that this disclosure will be thorough and complete, and will fully convey the scope of the disclosure to those skilled in the art.

The terms used herein are for the purpose of describing particular embodiments only and are not intended to be limiting. As used herein, the singular forms "a", "an" and "the" are intended to include the plural forms as well, unless the context clearly indicates otherwise. It will be further understood that the terms "comprise" and/or "comprising", "include" or "including", and "have" or "having", when used in the disclosure, specify the presence of stated elements, steps, operations, and/or devices, but do not preclude the presence or addition of one or more other elements, steps, operations, and/or devices.

In addition, the term "connection" or "coupling" may mean a physical and/or electrical connection or coupling. Further, "connection" or "coupling" may mean a direct or indirect connection or coupling, and an integrated or non-integrated connection or coupling.

It will be understood that when an element or a layer is referred to as being "on" another element or layer, it can be directly on another element or layer, or an intervening element or layer may also be present. Throughout the specification, the same reference numerals denote the same elements.

Although the terms "first", "second", and the like are used to describe various elements, these elements are not limited by these terms. These terms are used only to distinguish one element from another element. Therefore, the first elements described below may be the second elements, and so forth.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

In the following, some embodiments may be described with reference to a coordinate system including an x-axis, a y-axis, and a z-axis. However, other embodiments may not be limited thereto, and may be interpreted in a different sense.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a top plan view of a display device according to an embodiment.

FIG. 1 illustrates a schematic top plan view of a display device according to an embodiment. FIG. 1 illustrates a display device that may use a light emitting element as a light source, particularly, a display panel PNL provided in the display device.

For better understanding and ease of description, FIG. 1 briefly illustrates a structure of the display panel PNL based on a display area DA. However, in some embodiments, at least one driving circuit portion (for example, at least one of a scan driver and a data driver), wires, and/or pads, which are not shown, may be further disposed in the display panel PNL.

Referring to FIG. 1, the display panel PNL and a base layer BSL for forming the display panel may include the display area DA for displaying an image and a non-display area NDA excluding the display area DA. The display area DA may configure a screen on which an image may be displayed, and the non-display area NDA may be the remaining area except for the display area DA.

A pixel unit PXU may be disposed in the display area DA. The pixel unit PXU may include a first pixel PXL1, a second pixel PXL2, and/or a third pixel PXL3. Hereinafter, when arbitrarily referring to at least one of the first pixel PXL1, the second pixel PXL2, and the third pixel PXL3, or when comprehensively referring to two or more types of pixels thereof, they will be referred to as a "pixel PXL" or "pixels PXL".

The pixels PXL may be regularly arranged according to a stripe or PenTile® arrangement structure. However, the arrangement structure of the pixels PXL is not limited thereto, and the pixels PXL may be arranged in the display area DA in various structures and/or methods.

In some embodiments, two or more types of pixels PXL emitting light of different colors may be disposed in the display area DA. For example, in the display area DA, the first pixels PXL1 emitting light of the first color, the second pixels PXL2 emitting light of the second color, and the third pixels PXL3 emitting light of the third color may be arranged. At least one set of first to third pixels PXL1, PXL2, and PXL3 disposed to be adjacent to each other may form a pixel unit PXU that may emit light of various colors. For example, each of the first to third pixels PXL1, PXL2, and PXL3 may be a pixel that emits light of a color. In some embodiments, the first pixel PXL1 may be a red pixel that emits red light, the second pixel PXL2 may be a green pixel that emits green light, and the third pixel PXL3 may be a blue pixel that emits blue light, but the disclosure is not limited thereto.

In an embodiment, the first pixel PXL1, the second pixel PXL2, and the third pixel PXL3 may be provided with light emitting elements of the same color, and include color conversion layers of different colors disposed on respective light emitting elements, so that they may emit light of the first color, the second color, and the third color, respectively. In another embodiment, the first pixel PXL1, the second pixel PXL2, and the third pixel PXL3 may each be provided with a first color light emitting element, a second color light emitting element, and a third color light emitting element as a light source, respectively, so that they respectively emit light of the first color, second color, and third color. However, the color, type, and/or number of pixels PXL configuring each pixel unit PXU are not particularly limited. For example, the color of light emitted by each pixel PXL may be variously changed.

The pixel PXL may include at least one light source driven by a control signal (for example, a scan signal and a data signal) and/or a power source (for example, a first power source and a second power source). In an embodiment, the light source may include at least one light emitting element LD according to an embodiment of FIG. 2, for example, ultra-small cylindrical shape light emitting elements LD having a size as small as nanometer scale to micrometer scale. However, the disclosure is not limited thereto, and various types of light emitting elements LD may be used as a light source of the pixel PXL.

In an embodiment, each pixel PXL may be configured as an active pixel. However, the type, structure, and/or driving method of pixels PXL that may be applied to the display device are not particularly limited. For example, each pixel PXL may be configured as a pixel of a passive or active light emitting display device of various structures and/or driving methods.

Figure 2:
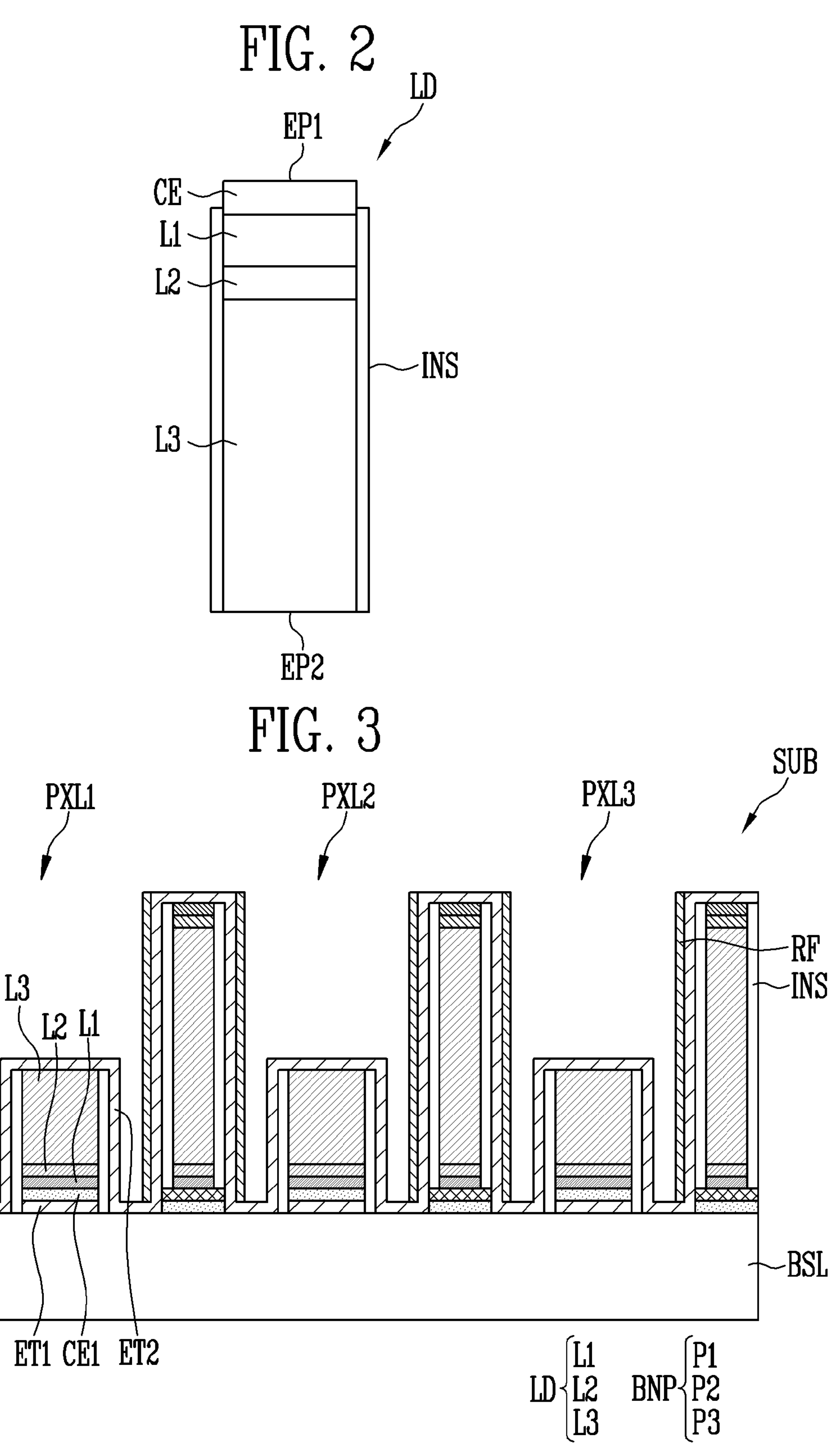
FIG. 2 illustrates a schematic cross-sectional view of a light emitting element according to an embodiment.

FIG. 2 illustrates a schematic cross-sectional view of a light emitting element according to an embodiment.

FIG. 2 illustrates a cylindrical shape light emitting element LD, but a type and/or shape of the light emitting element LD is not limited thereto.

Referring to FIG. 2, the light emitting element LD may include a first semiconductor layer L1, an active layer L2, a second semiconductor layer L3, and/or a contact electrode CE.

The light emitting element LD may be formed to have a cylindrical shape extending along a direction. The light emitting element LD may have a first end portion EP1 and a second end portion EP2. One of the first and second semiconductor layers L1 and L3 may be disposed on the first end portion EP1 of the light emitting element LD. The remaining one of the first and second semiconductor layers L1 and L3 may be disposed on the second end portion EP2 of the light emitting element LD. For example, the first semiconductor layer L1 may be disposed on the first end portion EP1 of the light emitting element LD, and the second semiconductor layer L3 may be disposed on the second end EP2 of the light emitting element LD.

In some embodiments, the light emitting element LD may be a light emitting element manufactured in a cylindrical shape through an etching method or the like. In the specification, the "cylindrical shape" includes a rod-like shape or bar-like shape with an aspect ratio greater than 1, such as a circular cylinder or a polygonal cylinder, but a shape of a cross-section thereof is not limited.

The light emitting element LD may have a size as small as a nanometer scale to a micrometer scale. For example, light emitting elements LD may each have a diameter (or width) and/or a length ranging from a nanometer scale to a micrometer scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer L1 may be a first conductive semiconductor layer. For example, the first semiconductor layer L1 may include a p-type semiconductor layer. For example, the first semiconductor layer L1 may include at least one semiconductor material of InAlGaN, GaN, AlGaN, InGaN, and AlN, and may include a p-type semiconductor layer doped with a first conductive dopant such as Mg. However, the material included in the first semiconductor layer L1 is not limited thereto, and the first semiconductor layer L1 may be made of various materials.

The active layer L2 may be disposed between the first semiconductor layer L1 and the second semiconductor layer L3. The active layer L2 may include at least one of a single well structure, a multi-well structure, a single quantum well structure, a multi-quantum well (MQW) structure, a quantum dot structure, and a quantum line structure, but is not necessarily limited thereto. The active layer L2 may include GaN, InGaN, InAlGaN, AlGaN, AlN, or a combination thereof, and in addition, it may include various other materials.

In case that a voltage of a threshold voltage or more is applied to respective ends of the light emitting element LD, the light emitting element LD emits light while electron-hole pairs may be combined in the active layer L2. By controlling the light emitting of the light emitting element LD by using this principle, the light emitting element LD may be used as a light source for various light emitting devices in addition to pixels of a display device.

The second semiconductor layer L3 may be disposed on the active layer L2, and may include a semiconductor layer of a type different from that of the first semiconductor layer L1. The second semiconductor layer L3 may include an n-type semiconductor layer. For example, the second semiconductor layer L3 may include a semiconductor material of at least one of InAlGaN, GaN, AlGaN, InGaN, and AlN, and may include an n-type semiconductor layer doped with a second conductive dopant such as Si, Ge, Sn, or the like, or a combination thereof. However, the material included in the second semiconductor layer L3 is not limited thereto, and the second semiconductor layer L3 may be made of various materials.

The contact electrode CE may be disposed on the first end portion EP1 and/or the second end portion EP2 of the light emitting element LD. FIG. 2 illustrates the case in which the contact electrode CE may be formed on the first semiconductor layer L1, but the disclosure is not necessarily limited thereto. For example, a separate contact electrode may be further disposed on the second semiconductor layer L3.

The contact electrode CE may include a transparent metal or transparent metal oxide. For example, the contact electrode CE may include at least one of an indium tin oxide (ITO), an indium zinc oxide (IZO), and a zinc tin oxide (ZTO), but is not limited thereto. As such, in case that the contact electrode CE is made of the transparent metal or transparent metal oxide, light generated in the active layer L2 of the light emitting element LD may transmit through the contact electrode CE to be emitted to the outside of the light emitting element LD.

An insulating film INS may be provided on a surface of the light emitting element LD. The insulating film INS may be directly disposed on surfaces of the first semiconductor layer L1, the active layer L2, the second semiconductor layer L3, and/or the contact electrode CE. The insulating film INS may expose the first and second end portions EP1 and EP2 of the light emitting element LD having different polarities. In some embodiments, the insulating film INS may expose side portions of the contact electrode CE and/or the second semiconductor layer L3 that are adjacent to the first and second end portions EP1 and EP2 of the light emitting element LD.

The insulating film INS may prevent an electrical short circuit that may occur in case that the active layer L2 contacts conductive materials other than the first and second semiconductor layers L1 and L3. In addition, the insulating film INS may minimize surface defects of the light emitting elements LD to improve lifespan and luminous efficiency of the light emitting elements LD.

The insulating film INS may include at least one of a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), and a titanium oxide (TiOx). For example, the insulating film INS may be configured as a double layer, and respective layers configuring the double layer may include different materials. For example, the insulating film INS may be formed as a double layer made of an aluminum oxide (AlOx) and a silicon oxide (SiOx), but is not limited thereto. In some embodiments, the insulating film INS may be omitted.

A light emitting device including the light emitting element LD described above may be used in the display panel PNL described above and various types of devices that require a light source. For example, the light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

FIG. 3 illustrates a schematic cross-sectional view of a light emitting substrate according to an embodiment.

FIG. 3 schematically illustrates a cross-sectional structure of a light emitting substrate SUB including the first pixel PXL1, the second pixel PXL2, and the third pixel PXL3 that may be adjacent to each other.

Referring to FIG. 3, the pixel PXL and the display device having the same may include a base layer BSL, and bank patterns BNP and light emitting elements LD disposed on the base layer BSL.

The base layer BSL may be a driving substrate including transistors and circuit elements configuring a pixel circuit (PXC in FIG. 4) of each pixel PXL.

The bank patterns BNP may be disposed at boundaries of the first to third pixels PXL1, PXL2, and PXL3 on the base layer BSL. Each of the bank patterns BNP may be provided to have a shape extending in a direction. For example, each of the bank patterns BNP may be provided on the base layer BSL in a shape extending from the base layer BSL in a third direction (Z-axis direction).

The bank patterns BNP may include a first semiconductor layer P1, a second semiconductor layer P3, and an active layer P2 interposed between the first and second semiconductor layers P1 and P3. For example, the first semiconductor layer P1, the active layer P2, and the second semiconductor layer P3 of each of the bank patterns BNP may be sequentially stacked on each other along the third direction (Z-axis direction) on the base layer BSL.

The first semiconductor layer P1 of the bank pattern BNP may include, for example, at least one P-type semiconductor layer. For example, the first semiconductor layer P1 of bank pattern BNP may include at least one semiconductor material of GaN, InAlGaN, AlGaN, InGaN, AlN, and InN, and may include a p-type semiconductor layer doped with a first conductive dopant (or p-type dopant) such as Mg, Zn, Ca, Sr, Ba, or a combination thereof. For example, the first semiconductor layer P1 of the bank pattern BNP may include a GaN semiconductor material doped with the first conductive dopant (or p-type dopant), but is not necessarily limited thereto as various materials may configure the first semiconductor layer P1 of the bank pattern BNP.

The active layer P2 of each of the bank patterns BNP may be disposed between the first semiconductor layer P1 and the second semiconductor layer P3. The active layer P2 of the bank pattern BNP may include at least one of a single well structure, a multi-well structure, a single quantum well structure, a multi-quantum well (MQW) structure, a quantum dot structure, and a quantum line structure, but is not necessarily limited thereto. For example, the active layer P2 of the bank pattern BNP may include GaN, InGaN, InAlGaN, AlGaN, AlN, or a combination thereof. However, various materials may configure the active layer P2 of the bank pattern BNP.

The second semiconductor layer P3 of the bank pattern BNP may be disposed on the active layer P2, and may include a semiconductor layer of a type different from that of the first semiconductor layer P1. In an embodiment, the second semiconductor layer P3 of the bank pattern BNP may include at least one n-type semiconductor layer. For example, the second semiconductor layer P3 of the bank pattern BNP may include a semiconductor material of at least one of GaN, InAlGaN, AlGaN, InGaN, AlN, and InN, and may be an n-type semiconductor layer doped with a second conductive dopant (or n-type dopant) such as Si, Ge, Sn, or the like, or a combination thereof. As an example, the second semiconductor layer P3 of the bank pattern BNP may include a GaN semiconductor material doped with the second conductive dopant (or n-type dopant). However, the materials configuring the second semiconductor layer P3 of the bank pattern BNP are not limited thereto as the second semiconductor layer P3 of the bank pattern BNP may be made of various materials.

In some embodiments, a reflective layer RF may be disposed on a side surface of each of the bank patterns BNP. The reflective layer RF may reflect light emitted from each of the light emitting elements LD to improve light output efficiency of the display panel PNL. In addition, the reflective layer RF may be disposed on the side surface of each of the bank patterns BNP to prevent color mixing between adjacent pixels PXL. The material of the reflective layer RF is not particularly limited, and may be made of various reflective materials.

In some embodiments, each of the bank patterns BNP may further include mask layers MK1 and MK2 disposed on the second semiconductor layer P3. The mask layers MK1 and MK2 may include a first mask layer MK1 disposed on the second semiconductor layer P3 and a second mask layer MK2 disposed on the first mask layer MK1. The first mask layer MK1 and the second mask layer MK2 may be made of different materials. For example, the first mask layer MK1 may include a silicon oxide (SiOx), and the second mask layer MK2 may include nickel (Ni), but are not limited thereto.

The light emitting elements LD may be disposed in the first to third pixels PXL1, PXL2, and PXL3, respectively. The light emitting elements LD may be disposed between the side surfaces of the bank patterns BNP on the base layer BSL.

Each of the light emitting elements LD may be provided in various shapes. As an example, the light emitting elements LD may have a long (for example, an aspect ratio greater than 1) rod-like shape or bar-like shape in the third direction (Z-axis direction), but the disclosure is not limited thereto. For example, each of the light emitting elements LD may have a pillar shape in which a diameter of an end portion thereof and a diameter of another end portion thereof are different from each other. In addition, the light emitting elements LD may be ultra-small light emitting diodes (LED) manufactured to have a diameter and/or a length of a nanometer scale to a micrometer scale. However, the disclosure is not necessarily limited thereto, and the size of the light emitting element LD may be variously changed to meet a required condition (or design condition) of a lighting device or a display device to which the light emitting element LD may be applied.

A light emitting element LD may include the first semiconductor layer L1, the second semiconductor layer L3, and the active layer L2 interposed between the first and second semiconductor layers L1 and L3. For example, the first semiconductor layer L1, the active layer L2, and the second semiconductor layer L3 of each of the light emitting elements LD may be sequentially stacked along the third direction (Z-axis direction) on the base layer BSL. Since the first semiconductor layer L1, the active layer L2, and the second semiconductor layer L3 of the light emitting element LD have been described in detail with reference to FIG. 2, redundant contents will be omitted.

In some embodiments, an electron blocking layer may be further disposed between the active layer L2 and the first semiconductor layer L1 of the light emitting element LD. The electron blocking layer may block electrons supplied from the second semiconductor layer L3 from flowing to the first semiconductor layer L1, thereby increasing the recombined probability of electron-holes in the active layer L2. An energy bandgap of the electron blocking layer may be larger than that of the active layer L2 and/or the first semiconductor layer L1, but is not limited thereto.

In some embodiments, a super lattice layer SL may be further disposed between the active layer L2 and the second semiconductor layer L3 of the light emitting element LD. The super lattice layer may reduce stress of the active layer L2 and the second semiconductor layer L3, thereby improving quality of the light emitting elements LD. For example, the super lattice layer may be formed to have a structure in which InGaN and GaN are alternately stacked, but is not limited thereto.

The second semiconductor layer L3 of the light emitting element LD is disposed on the active layer L2, and may include a semiconductor layer of a type different from that of the first semiconductor layer L1. In an embodiment, the second semiconductor layer L3 of the light emitting element LD may include at least one n-type semiconductor layer. For example, the second semiconductor layer L3 of the light emitting element LD may include a semiconductor material of at least one of GaN, InAlGaN, AlGaN, InGaN, AlN, and InN, and may be an n-type semiconductor layer doped with a second conductive dopant (or n-type dopant) such as Si, Ge, Sn, or the like, or a combination thereof. As an example, the second semiconductor layer L3 of the light emitting element LD may include a GaN semiconductor material doped with the second conductive dopant (or n-type dopant). However, the material configuring the second semiconductor layer L3 of the light emitting element LD is not limited thereto as the second semiconductor layer L3 of the light emitting element LD may be made of various materials.

In an embodiment, the light emitting elements LD and the bank patterns BNP may include the same material. For example, the first semiconductor layer L1, the active layer L2, and/or the second semiconductor layer L3 of the light emitting element LD may include the same material as the first semiconductor layer P1, the active layer P2, and/or the second semiconductor layer P3 of the above-described bank pattern BNP, respectively. In this case, the first semiconductor layer L1, the active layer L2, and/or the second semiconductor layer L3 of the light emitting element LD may be simultaneously formed in the same process as the first semiconductor layer P1, the active layer P2, and/or the second semiconductor layer P3 of the bank pattern BNP, respectively. Accordingly, it may be possible to secure process economics by simplifying the manufacturing process of the display device.

The light emitting element LD may be disposed on a first electrode ET1 provided on the base layer BSL. For example, the first semiconductor layer L1 of the light emitting element LD may be disposed on the first electrode ET1 to be electrically connected to the first electrode ET1. The first electrode ET1 may include a metal or metal oxide. For example, the first electrode ET1 may include copper (Cu), gold (Au), silver (Ag), chromium (Cr), titanium (Ti), aluminum (Al), nickel (Ni), indium (In), tin (Sn), and an oxide thereof or an alloy thereof, or a combination thereof, but is not necessarily limited thereto.

In some embodiments, contact electrodes CE1 and CE2 may be further disposed between the base layer BSL and the light emitting element LD and/or the bank pattern BNP. The contact electrodes CE1 and CE2 may include a first contact electrode CE1 provided between the light emitting element LD and the base layer BSL, and a second contact electrode CE2 provided between the bank pattern BNP and the base layer BSL.

The first contact electrode CE1 may be disposed between the first semiconductor layer L1 of the light emitting element LD and the first electrode ET1 provided on the base layer BSL. The light emitting element LD may be electrically connected to the first electrode ET1 provided on the base layer BSL through the first contact electrode CE1.

The second contact electrode CE2 may include the same material as that of the first contact electrode CE1. For example, the first and second contact electrodes CE1 and CE2 may each include a metal or metal oxide. For example, the first and second contact electrodes CE1 and CE2 may respectively include copper (Cu), gold (Au), silver (Ag), chromium (Cr), titanium (Ti), aluminum (Al), nickel (Ni), indium (In), tin (Sn), and an oxide thereof or an alloy thereof, or a combination thereof, but is not necessarily limited thereto. The second contact electrode CE2 may be simultaneously formed in the same process as that of the first contact electrode CE1, but is not necessarily limited thereto.

In some embodiments, a hard mask layer HM may be further disposed between the bank pattern BNP and the second contact electrode CE2. The hard mask layer HM may be disposed between the first semiconductor layer P1 and the second contact electrode CE2 of the bank pattern BNP. The hard mask layer HM may be omitted according to embodiments.

The insulating films INS may be provided on surfaces of the light emitting elements LD and/or the bank patterns BNP. The insulating film INS may be provided on side surfaces of the light emitting element LD and/or the bank pattern BNP. The insulating film INS may prevent an electrical short circuit that may occur in case that the active layer L2 of the light emitting element LD contacts conductive materials other than the first and second semiconductor layers L1 and L3. In addition, the insulating film INS may minimize surface defects of the light emitting elements LD to improve lifespan and luminous efficiency of the light emitting elements LD.

The insulating film INS may cover the side surfaces of the light emitting element LD and/or the bank pattern BNP, but may be partially removed to expose upper surfaces of the light emitting element LD and/or the bank pattern BNP. For example, the insulating film INS may cover the side surface of the light emitting element LD, but may be partially removed to expose the second semiconductor layer L3 of the light emitting element LD.

The insulating film INS may include a silicon oxide (SiOx), a silicon nitride (SiNx), a silicon oxynitride (SiOxNy), a silicon oxycarbide (SiOxCy), an aluminum oxide (AlOx), an aluminum nitride (AlNx), a zirconium oxide (ZrOx), a hafnium oxide (HfOx), a titanium oxide (TiOx), or a combination thereof, but is not necessarily limited thereto.

A second electrode ET2 may be disposed on each of the light emitting elements LD. The second electrode ET2 may be directly disposed on the upper surface of the light emitting element LD exposed by the insulating film INS, and may be in contact with the second semiconductor layer L3 of the light emitting element LD. The second electrode ET2 may be entirely disposed on the first to third pixels PXL1, PXL2, and PXL3.

The second electrode ET2 may be made of various transparent conductive materials. For example, the second electrode ET2 may include at least one of various transparent conductive materials including an indium tin oxide (ITO), an indium zinc oxide (IZO), an indium tin zinc oxide (ITZO), an aluminum zinc oxide (AZO), a gallium zinc oxide (GZO), a zinc tin oxide (ZTO), and a gallium tin oxide (GTO), and may be realized to be substantially transparent or translucent to satisfy a light transmittance. Accordingly, light emitted from the light emitting elements LD may pass through the second electrode ET2 to be emitted to the outside of the display panel PNL.

Figure 4:
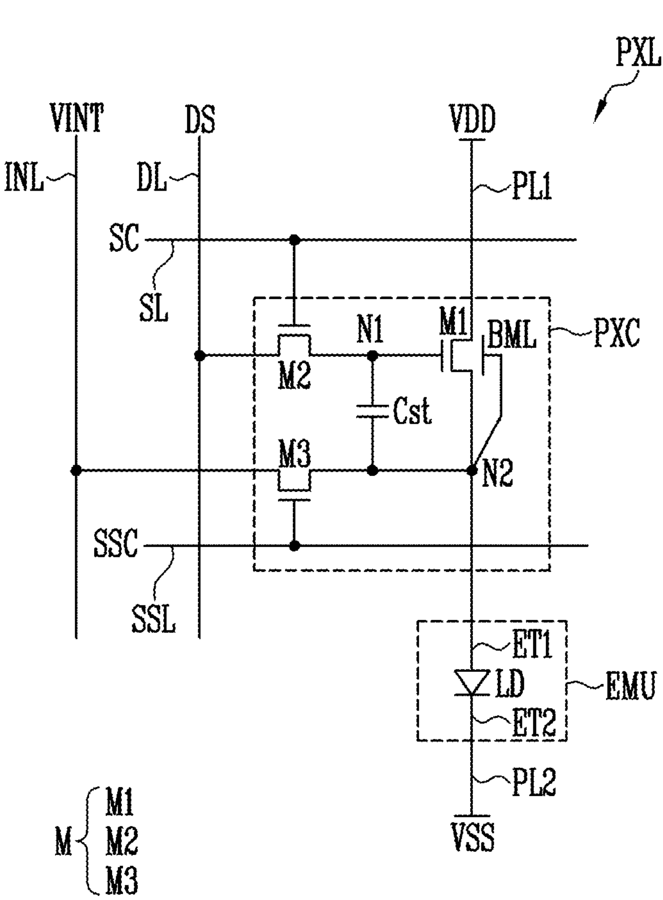
FIG. 4 and FIG. 5 illustrate schematic circuit diagrams of a pixel according to an embodiment.
Figure 5:
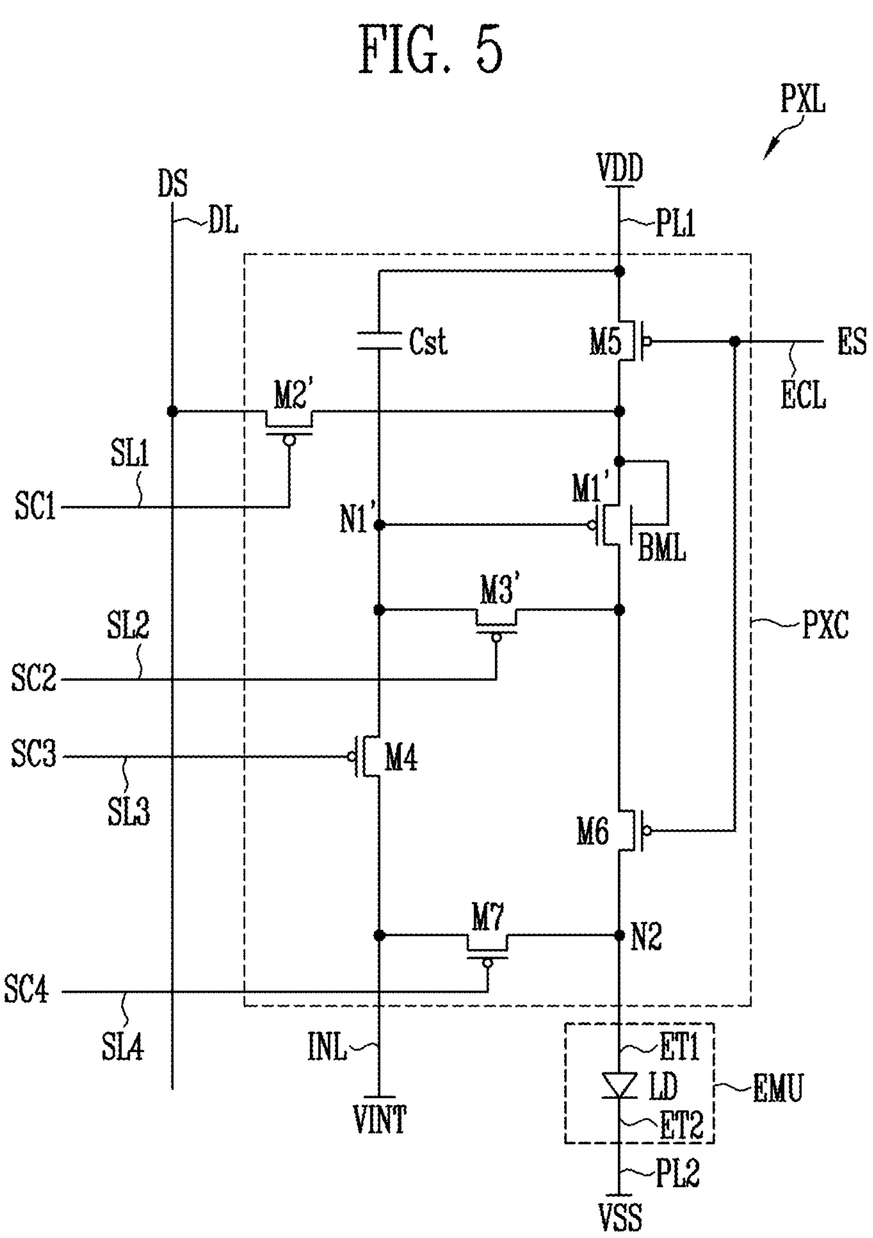

FIG. 4 and FIG. 5 illustrate schematic circuit diagrams of a pixel according to an embodiment.

In some embodiments, each pixel PXL illustrated in FIG. 4 and FIG. 5 may be one of the pixels PXL disposed in the display area DA of FIG. 1. For example, the pixel PXL of FIG. 4 and FIG. 5 may be one of the first pixel PXL1, the second pixel PXL2, and the third pixel PXL3. In addition, in an embodiment, the pixels PXL disposed in the display area DA may have substantially the same or similar structure. The pixels PXL may have various structures in addition to the structures disclosed in embodiments of FIG. 4 and FIG. 5.

Referring to FIG. 4 and FIG. 5, the pixel PXL may be electrically connected to a scan line SL and a data line DL. In addition, the pixel PXL may be electrically connected to a first power source VDD (or a first power line PL1) and a second power source VSS (or a second power line PL2). In an embodiment, the pixel PXL may be further connected to at least one other signal line and/or power line. For example, the pixel PXL may be electrically connected to a control line SSL and an initialization power line INL to which a voltage of an initialization power source VINT may be applied.

The pixel PXL may include a light emitting part EMU for generating light of luminance corresponding to each data signal DS. In addition, the pixel PXL may further include a pixel circuit PXC for driving the light emitting part EMU.

The light emitting part EMU may include a first electrode ET1, a second electrode ET2, and at least one light emitting element LD electrically connected between the first and second electrodes ET1 and ET2. The light emitting element LD may be electrically connected to the first power source VDD through the first electrode ET1 and/or the pixel circuit PXC, and may be electrically connected to the second power source VSS through the second electrode ET2.

The first power source VDD and the second power source VSS may supply voltages of different potentials. A potential difference between the first power source VDD and the second power source VSS may be greater than or equal to a threshold voltage of the light emitting element LD.

In an embodiment, the light emitting part EMU may include a single light emitting element LD connected in a forward direction between the pixel circuit PXC and the second power source VSS. In another embodiment, the light emitting part EMU may include light emitting elements LD that are connected in a forward direction between the first power source VDD and the second power source VSS. For example, the light emitting unit EMU may include light emitting elements LD that are connected in parallel, in series, or in parallel-series between the pixel circuit PXC and the second power source VSS. In an embodiment, each light emitting element LD may be an inorganic light emitting diode manufactured with a small size ranging from nanometers to micrometers by using a nitride-based semiconductor material or a phosphide-based semiconductor material, but is not limited necessarily thereto. The type, connection structure, and/or number of the light emitting elements LD configuring the light emitting part EMU may be variously changed according to embodiments.

At least one light emitting element LD connected to in a forward direction between the first power source VDD and the second power source VSS may configure an effective light source of each pixel PXL. In case that a driving current is supplied to each light emitting element LD through the pixel circuit PXC of the corresponding pixel PXL, the light emitting element LD may emit light with a luminance corresponding to the driving current. Accordingly, the pixel PXL may emit light with a luminance corresponding to the driving current.

The pixel circuit PXC may be electrically connected between the first power source VDD and the light emitting part EMU. In addition, the pixel circuit PXC may be electrically connected to the scan line SL and the data line DL, and may be supplied with a scan signal SC and a data signal DS from the scan line SL and the data line DL, respectively. In addition, the pixel circuit PXC may be electrically connected to the control line SSL and the initialization power line INL, and may be supplied with a control signal SSC and the voltage of the initialization power source VINT from the control line SSL and the initialization power line INL, respectively.

The pixel circuit PXC may include at least one transistor M and a capacitor Cst. For example, the pixel circuit PXC may include a first transistor M1, a second transistor M2, a third transistor M3, and the capacitor Cst.

The first transistor M1 may be electrically connected between the first power source VDD and a second node N2. The second node N2 may be a node at which the pixel circuit PXC and the light emitting part EMU are connected to each other. For example, the second node N2 may be a node at which an electrode (for example, a source electrode) of the first transistor M1 and the first electrode ET1 of the light emitting unit EMU (for example, an anode of the light emitting part EMU) may be connected to each other. A gate electrode of the first transistor M1 may be electrically connected to a first node N1.

The first transistor M1 may be a driving transistor of each pixel PXL. For example, the first transistor M1 may be electrically connected between the first power line PL1 and the first electrode ET1 of each pixel PXL to control a driving current supplied to the light emitting part EMU in response to a voltage of the first node N1.

In an embodiment, the first transistor M1 may further include a bottom conductive layer BML (also referred to as a "back gate electrode"). In an embodiment, the bottom conductive layer BML may be electrically connected to an electrode (for example, a source electrode) of the first transistor M1.

In an embodiment in which the first transistor M1 includes the bottom conductive layer BML, by applying a back-biasing voltage to the bottom conductive layer BML of the first transistor M1, a back-biasing technique (or a sync technique) of moving a threshold voltage of the first transistor M1 in a negative or positive direction may be applied. In addition, in case that the bottom conductive layer BML is disposed to overlap a semiconductor pattern configuring a channel of the first transistor M1, light incident on the semiconductor pattern may be blocked, thereby stabilizing an operational characteristic of the first transistor M1.

The second transistor M2 may be electrically connected between the data line DL and the first node N1. In addition, a gate electrode of the second transistor M2 may be electrically connected to the scan line SL of the corresponding horizontal line. In case that the scan signal SC of a gate-on voltage (for example, a logic high voltage or a high level voltage) is supplied from the scan line SL, the second transistor M2 may be turned on to electrically connect the data line DL and the first node N1.

The second transistor M2 may be a switching transistor for transmitting each data signal DS to the inside of the pixel PXL. For example, for each frame period, a data signal DS of the corresponding frame may be supplied to the data line DL, and the data signal DS may be transmitted to the first node N1 through the second transistor M4 during a period in which the scan signal SC of the gate-on voltage may be supplied. For example, for each horizontal period configuring each frame period, the scan signal SC of a gate-on voltage may be simultaneously supplied to the pixels PXL of a horizontal line corresponding to the corresponding horizontal period. Accordingly, the second transistors M2 provided to the pixels PXL of the corresponding horizontal line may be turned on, so that respective data signals DS supplied to the data lines DL may be simultaneously supplied to the pixels PX of the corresponding horizontal line.

A first electrode of the capacitor Cst may be electrically connected to the first node N1. A second electrode of the capacitor Cst may be electrically connected to the second node N2. The capacitor Cst may be a storage capacitor for storing each data signal DS inside the pixel PXL. For example, the capacitor Cst may be charged with a voltage corresponding to the data signal DS supplied to the first node N1 during each frame period.

The third transistor M3 may be electrically connected between the second node N2 and the initialization power line INL. In addition, a gate electrode of the third transistor M3 may be electrically connected to the control line SSL of the corresponding horizontal line.

The third transistor M3 may be an initialization transistor that transmits the voltage of the initialization power source VINT to the first electrode ET1 of each pixel PXL during the driving period of the display panel PNL. For example, the third transistor M3 may be turned on by the control signal SSC of a gate-on voltage supplied to a corresponding pixel row. In case that the third transistor M3 is turned on, the voltage of the initialization power source VINT during the driving period of the display panel PNL may be transmitted to each first electrode ET1.

In an embodiment, the scan signals SC of the gate-on voltage may be sequentially supplied to the scan lines SL of respective pixel rows arranged in the display area DA during the driving period of the display panel PNL. In addition, the control signals SSC of the gate-on voltage may be sequentially supplied to the control lines SSL of respective pixel rows to be synchronized with the scan signals SC of the gate-on voltage. Accordingly, in each horizontal period, the second and third transistors M2 and M3 of the pixels PXL arranged in the corresponding horizontal line may be turned on, so that voltages (for example, a voltage difference between the voltage of the data signal DS corresponding to each pixel PXL and the voltage of the initialization power source VINT) corresponding to the respective data signals DS supplied to the respective data lines DL may be stored in respective capacitors Cst.

The third transistor M3 may be turned on by the control signal SSC of the gate-on voltage supplied to the corresponding pixel row during the sensing period for detecting the characteristic and the like of each pixel PXL. In case that the third transistor M3 is turned on, the second node N2 may be electrically connected to the initialization power line INL. During the sensing period, the initialization power line INL may be connected to a sensing circuit. Accordingly, the voltage of the second node N2 may be transmitted to the sensing circuit through the initialization power line INL. The voltage of the second node N2 transmitted to the initialization power line INL may be provided to a driving circuit (for example, a timing controller) via the sensing circuit to be used to compensate for characteristic deviation of the pixels PXL.

In an embodiment, the control signals SSC of the gate-on voltage may be sequentially supplied to the control lines SSL of respective pixel rows arranged in the display area DA during the sensing period for detecting the characteristic and the like of the pixels PXL. Accordingly, in each horizontal period, the second nodes N2 of pixels PXL arranged in the corresponding pixel row may be connected to the sensing circuit. Accordingly, the characteristic of the pixels PXL may be detected through the initialization power line INL during the sensing period.

In FIG. 4, all of the transistors M included in the pixel circuit PXC are illustrated as n-type transistors, but the disclosure is not necessarily limited thereto. For example, at least one of the first, second, and third transistors M1, M2, and M3 may be changed to a P-type transistor. In addition, the structure and driving method of the pixel circuit PXC and/or the pixel PXL may be variously changed according to embodiments.

The structure and driving method of the pixel circuit PXC and/or the pixel PXL may be variously changed according to embodiments. For example, the pixel circuit PXC may be configured as in an embodiment of FIG. 5. In describing an embodiment of FIG. 5, a duplicate description of a configuration similar to or the same as that of an embodiment of FIG. 4 will be omitted.

Referring to FIG. 5, the pixel PXL may be electrically connected to at least one scan line SL (or at least one gate line including the scan line SL) and the data line DL. For example, the pixel PXL may be electrically connected to a first scan line SL1, a second scan line SL2, a third scan line SL3, a fourth scan line SL4, and the data line DL. In addition, the pixel PXL may be connected to the first power source VDD (or first power line PL1) and the second power source VSS (or second power line PL2). In an embodiment, the pixel PXL may further be connected to at least one other signal line. For example, the pixel PXL may be electrically connected to a light emitting control line ECL.

In an embodiment, the first scan line SL1, the second scan line SL2, the third scan line SL3, and the fourth scan line SL4 may be supplied with scan signals SC of the gate-on voltage at different time points. In this case, the first scan line SL1, the second scan line SL2, the third scan line SL3, and the fourth scan line SL4 may be separated from each other.

In another embodiment, at least two scan lines SL of the first scan line SL1, the second scan line SL2, the third scan line SL3, and the fourth scan line SL4 may be supplied with the scan signal SC of the gate-on voltage at the same time point, and they may be integrated into one wire. For example, the first scan line SL1 and the second scan line SL2 may be supplied with a first scan signal SC1 and a second scan signal SC2 of the gate-on voltage at the same time point. In this case, the first scan line SL1 and the second scan line SL2 may be integrated into one scan line SL, and the first scan signal SC1 and the second scan signal SC2 may be substantially the same scan signals SC.

In an embodiment, the first scan line SL1 and the second scan line SL2 may be scan lines SL for transmitting, so as to supply respective data signals DS to the pixels PXL of a corresponding horizontal line, the first scan signal SC1 (for example, a current scan signal) supplied as the gate-on voltage during a corresponding horizontal period to respective pixels PXL. The third scan line SL3 may be a scan line SL for transmitting, so as to initialize the voltages of respective first nodes N1 before supplying respective data signals DS to the pixels PXL of a corresponding horizontal line, the third scan signal SC3 (for example, a previous scan signal) supplied as the gate-on voltage before the scan signal SC1 to respective pixels PXL. The fourth scan line SL4, during a period for supplying respective data signals DS to the pixels PXL of a corresponding horizontal line or during before and after the period for supplying the respective data signals DS to the pixels PXL of the corresponding horizontal line, may be a scan line SL for transmitting, so as to transmit the voltage of the initialization power source VINT to respective second nodes N2, the fourth scan signal SC4 supplied as the gate-on voltage to respective pixels PXL. The fourth scan line SL4 may be integrated with at least one of the first scan line SL1, the second scan line SL2, and the third scan line SL3, or may be separated from the first scan line SL1, the second scan line SL2, and the third scan line SL3.

In an embodiment, the light emitting control line ECL, after respective scan signals SC may be supplied to the first to fourth scan lines SL1, SL2, SL3, and SL4, may be a control line for transmitting an emitting control signal ES supplied as a gate-on voltage to respective pixels PXL. For example, during the period in which the scan signals SC of the gate-on voltage may be supplied to the first to fourth scan lines SL1, SL2, SL3, and SL4, a light emitting control signal ES of a gate-off voltage may be supplied to the light emitting control line ECL. During each frame period, after the scan signals SC of the gate-on voltage may be supplied to the first to fourth scan lines SL1, SL2, SL3, and SL4 of the corresponding pixel row so that the voltage corresponding to each of the data signals DS is charged in the capacitor Cst, the light emitting control signal ES of the gate-on voltage may be supplied to the light emitting control line ECL of the corresponding pixel row. Accordingly, the pixels PXL may emit light with a luminance corresponding to each of the data signals DS.

The pixel circuit PXC may include transistors M and at least one capacitor Cst. For example, the pixel circuit PXC may include a first transistor M1', a second transistor M2', a third transistor M3', a fourth transistor M4, a fifth transistor M5, a sixth transistor M6, a seventh transistor M7, and a capacitor Cst.

The first transistor M1' may be electrically connected between the first power source VDD and the second node N2. For example, an electrode (for example, a source electrode) of the first transistor M1' may be electrically connected to the first power source VDD via the fifth transistor M5, and another electrode (for example, a drain electrode) of the first transistor M1' may be connected to the first electrode ET1 of the light emitting part EMU (for example, an anode electrode of the light emitting part EMU) via the sixth transistor M6. In addition, a gate electrode of the first transistor M1' may be electrically connected to a first node N1'. The first transistor M1' may be a driving transistor that controls a driving current supplied to the light emitting part EMU in response to a voltage of the first node N1'.

In an embodiment, the first transistor M1' may further include the bottom conductive layer BML. In an embodiment, the bottom conductive layer BML may be electrically connected to an electrode (for example, a source electrode) of the first transistor M1'.

The second transistor M2' may be electrically connected between the data line DL and an electrode (for example, the source electrode) of the first transistor M1'. In addition, a gate electrode of the second transistor M2' may be electrically connected to the first scan line SL1 of the corresponding horizontal line. The second transistor M2' may be turned on in case that the first scan signal SC1 of the gate-on voltage is supplied from the first scan line SL1 to electrically connect the data line DL to an electrode of the first transistor M1'. Accordingly, in case that the second transistor M2' is turned on, the data signal DS supplied from the data line DL may be transmitted to the first transistor M1'.

The third transistor M3' may be electrically connected between another electrode (for example, the drain electrode) of the first transistor M1' and the first node N1'. In addition, a gate electrode of the third transistor M3' may be electrically connected to the second scan line SL2 (or the first scan line SL1) of the corresponding horizontal line. The third transistor M3', in case that the second scan signal SC2 (or the first scan signal SC1) of the gate-on voltage is supplied from the second scan line SL2 (or the first scan line SL1), may be turned on to connect the first transistor M1' in a diode form. Accordingly, during the period in which the second scan signal SC2 (or the first scan signal SC1) of the gate-on voltage may be supplied, the first transistor M1' may be turned on in a diode-connected form. Accordingly, the data signal DS from the data line DL may be supplied to the first node N1' by sequentially passing through the second transistor M2', the first transistor M1', and the third transistor M3'. Accordingly, the capacitor Cst may be charged with voltages corresponding to the data signal DS and a threshold voltage of the first transistor M1'.

The fourth transistor M4 may be electrically connected between the first node N1' and the initialization power source VINT. In addition, a gate electrode of the fourth transistor M4 may be electrically connected to the third scan line SL3 of the corresponding horizontal line. The fourth transistor M4 may be turned on in case that the third scan signal SC3 of the gate-on voltage is supplied to the third scan line SL3 to transmit the voltage of the initialization power source VINT to the first node N1'.

In some embodiments, the voltage of the initialization power source VINT may be equal to or less than the lowest voltage of the data signal DS. Before the first scan signal SC1 of the gate-on voltage may be supplied to each pixel PXL, the third scan signal SC3 of the gate-on voltage may be supplied to the third scan line SL3. Accordingly, before the data signal DS of each frame may be supplied to each pixel PXL, the first node N1' may be initialized with the voltage of the initialization power source VINT. Accordingly, regardless of the voltage of the data signal DS of the previous frame, the first transistor M1' may be diode-connected in a forward direction during the period in which the first scan signal SC1 of the gate-on voltage may be supplied to the first scan line SL1. Accordingly, the data signal DS of the corresponding frame may be transmitted to the first node N1'.

The fifth transistor M5 may be electrically connected between the first power source VDD and the first transistor M1'. In addition, a gate electrode of the fifth transistor M5 may be electrically connected to the light emitting control line ECL of the corresponding horizontal line. The fifth transistor M5 may be turned off in case that the light emitting control signal ES of the gate-off voltage (for example, a logic low voltage, or a high level voltage) is supplied to the light emitting control line ECL, and may be turned on in other cases.

The sixth transistor M6 may be electrically connected between the first transistor M1' and the second node N2. In addition, a gate electrode of the sixth transistor M6 may be electrically connected to the light emitting control line ECL of the corresponding horizontal line. The sixth transistor M6 may be turned off in case that the light emitting control signal ES of the gate-off voltage is supplied to the light emitting control line ECL, and may be turned on in other cases.

The fifth and sixth transistors M5 and M6 may control the light emitting period of the pixel PXL. For example, in case that the fifth and sixth transistors M5 and M6 are turned on, a current path in which a driving current may sequentially pass through the first power source VDD, the fifth transistor M5, the first transistor M1', the sixth transistor M6, and the light emitting part EMU to flow into the second power source VSS, may be formed. In addition, in case that the fifth and/or sixth transistors M5 and T6 are turned off, the current path is blocked, and thus light emitting of the pixel PXL may be prevented.

The seventh transistor M7 may be electrically connected between the second node N2 and the initialization power line INL. In addition, a gate electrode of the seventh transistor M7 may be electrically connected to the fourth scan line SL4 of the corresponding horizontal line. The seventh transistor M7 may be electrically connected to the first electrode ET1 (for example, the first electrode ET1 of the light emitting part EMU) of the corresponding pixel PXL through the second node N2.

The seventh transistor M7 may be an initialization transistor that transmits the voltage of the initialization power source VINT to the first electrode ET1 of each pixel PXL during the driving period of the display device. For example, the seventh transistor M7 may be turned on by the fourth scan signal SC4 of the gate-on voltage supplied to the fourth scan line SL4 of the corresponding pixel row. In case that the seventh transistor M7 is turned on, the voltage of the initialization power source VINT during the driving period of the display device may be transmitted to each first electrode ET1.

In an embodiment, the seventh transistors M7 of the pixels PXL may share the fourth scan line SL4 disposed to the corresponding horizontal line, and may be simultaneously turned on by the fourth scan signal SC4 of the gate-on voltage supplied to the fourth scan line SL4. The seventh transistors M7 of the pixels PXL sequentially arranged in different pixel rows may be connected to different gate lines (for example, respective fourth scan lines SL4 corresponding to respective pixel rows) to be sequentially turned on.

The scan signal SC and/or the initialization power source VINT for controlling the operation of the seventh transistor M4 may be variously changed. For example, in another embodiment, the gate electrode of the seventh transistor M7 may be connected to the first scan line SL1 or the third scan line SL3 of the corresponding horizontal line. In this case, the seventh transistor M7 may be turned on by the first scan signal SC1 or the third scan signal SC3 of the gate-on voltage to supply the voltage of the initialization power source VINT to the first electrode ET1 of the light emitting part EMU. In addition, in some embodiments, the fourth transistor M4 and the seventh transistor M7 may be connected to different initialization power sources having different potentials. For example, in some embodiments, the pixel PXL may be connected to at least two different initialization power sources, and the first node N1' and the first electrode ET1 of the light emitting part EMU may be initialized by the initialization power sources of different potentials.

The capacitor Cst may be electrically connected between the first power source VDD and the first node N1'. The capacitor Cst may be charged with voltages corresponding to the data signal DS supplied to the first node N1' and the threshold voltage of the first transistor M1' during each frame period.

In FIG. 5, all of the transistors M included in the pixel circuit PXC are illustrated as p-type transistors, but the disclosure is not necessarily limited thereto. For example, at least one of the first transistor M1', the second transistor M2', the third transistor M3', the fourth transistor M4, the fifth transistor M5, the sixth transistor M6, and the seventh transistor M7 may be changed as an n-type transistor. In this case, the gate-on voltage (for example, a logic high voltage) for turning on the n-type transistor may be a high level voltage.

Figure 6:
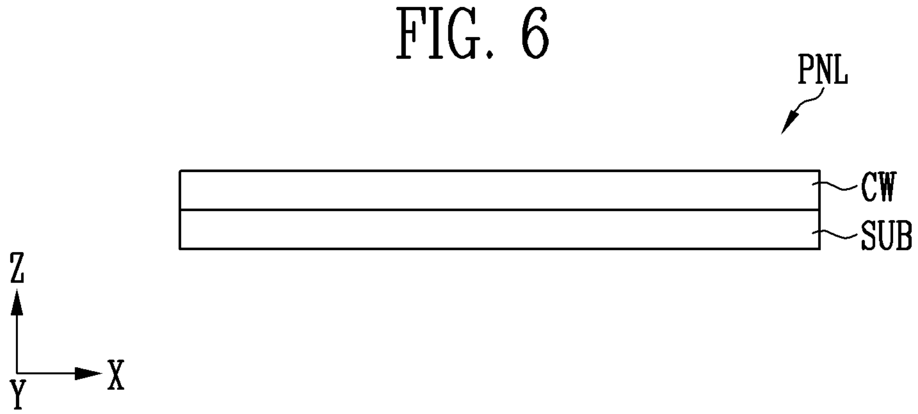
FIG. 6 illustrates a schematic cross-sectional view of a display panel according to an embodiment.
Figure 7:
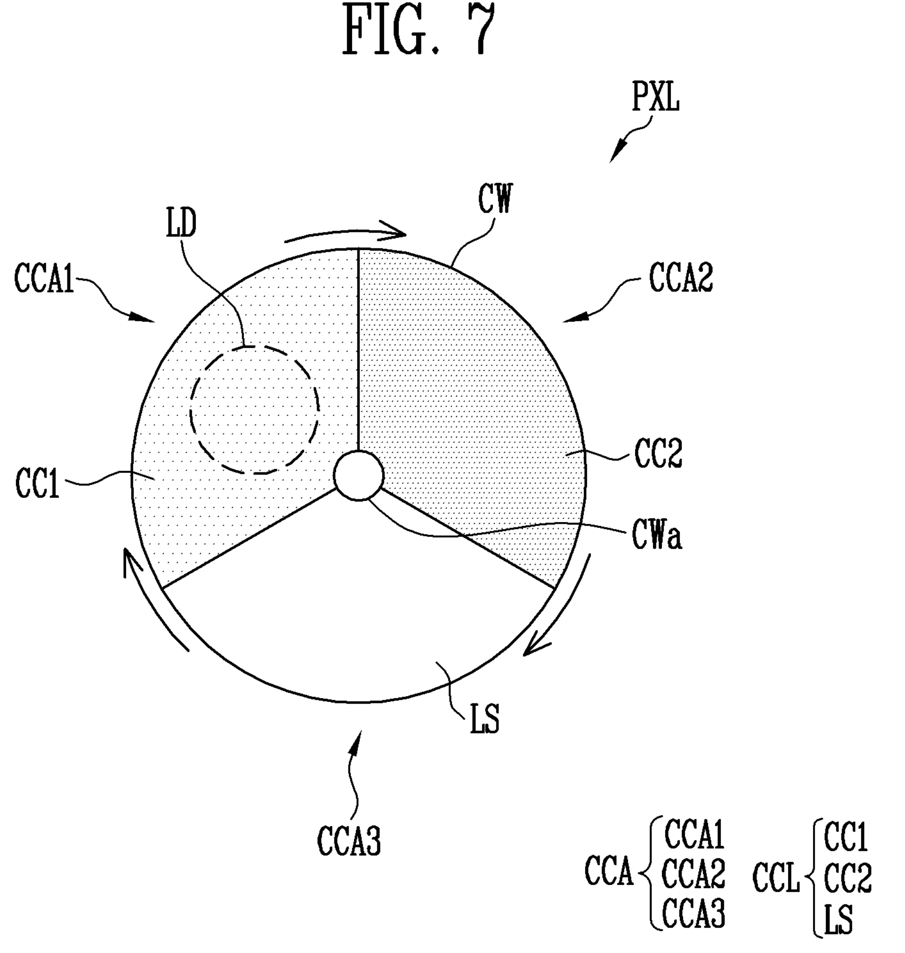
FIG. 7 illustrates a schematic top plan view of a color wheel according to an embodiment.
Figure 8:
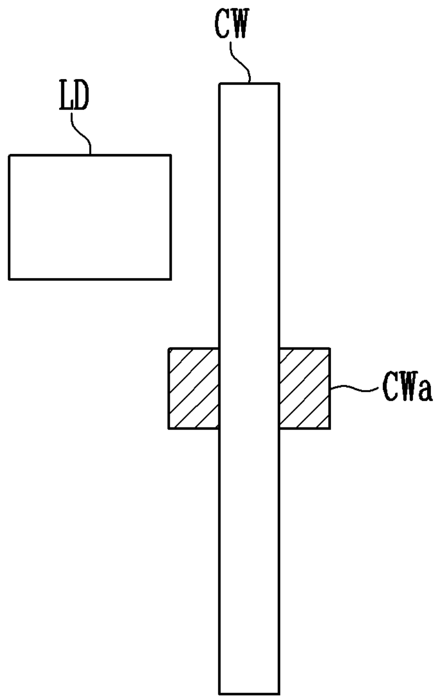
FIG. 8 illustrates a schematic side view of a color wheel according to an embodiment.

FIG. 6 illustrates a schematic cross-sectional view of a display panel according to an embodiment. FIG. 7 illustrates a schematic top plan view of a color wheel according to an embodiment. FIG. 8 illustrates a schematic side view of a color wheel according to an embodiment.

Referring to FIG. 1 to FIG. 8, the display panel PNL may include the light emitting substrate SUB and a color wheel CW. In an embodiment, the light emitting substrate SUB and the color wheel CW may be sequentially disposed along a display direction (for example, the third direction (Z-axis direction)) of the display panel PNL.

The light emitting substrate SUB may configure a base surface of the display panel PNL. Individual components of the display panel PNL may be disposed on the light emitting substrate SUB. For example, respective pixels PXL may be disposed in pixel areas on the light emitting substrate SUB.

The light emitting substrate SUB may include circuit elements configuring the pixel circuits PXC of the pixels PXL, and wires connected to the circuit elements. In addition, the light emitting substrate SUB may include the light emitting elements LD configuring the light emitting parts EMU of the pixels PXL, and the electrodes and/or the wires connected to the light emitting elements LD. For example, at least one light emitting element LD configuring the light emitting part EMU of each pixel PXL may be provided in each pixel area, particularly the light emitting area, of the light emitting substrate SUB.

The color wheel CW may be disposed on the light emitting substrate SUB. In an embodiment, the light emitting element LD provided in the light emitting part EMU of each pixel PXL may be connected to the pixel circuit PXC and at least one power line of the corresponding pixel PXL. The light emitting element LD may emit light with a luminance corresponding to an electrical signal (for example, driving current) provided from the pixel circuit PXC. Light generated by the light emitting elements LD of the light emitting substrate SUB may pass through the color wheel CW to be emitted to the outside.

In an embodiment, the pixel PXL may include a light emitting element LD that emits a third color (or, blue), and may convert light emitted from the light emitting element LD into light of different colors to emit a light of first to third color lights as the color wheel CW including a color conversion area CCA rotates.

For example, the color wheel CW may include a first color conversion area CCA1 that emits a first color (or red), a second color conversion area CCA2 that emits a second color (or green), and a third color conversion area CCA3 that emits a third color (or blue). The color wheel CW may be rotated so that one of the first to third color conversion areas CCA1, CCA2, and CCA3 overlaps the light emitting element LD. For example, since the first color conversion area CCA1, the second color conversion area CCA2, or the third color conversion area CCA3 is selectively positioned on the light emitting element LD as the color wheel CW is rotated, the first to third colors may be implemented in a time division form by using one light emitting element LD. The color wheel CW may be driven by a wheel rotation axis CWa. The wheel rotation axis Cwa may be rotated by a motor, and may be rotated according to an image signal of the light emitting substrate SUB.

In case that the first color conversion area CCA1 overlaps the light emitting element LD as the color wheel CW rotates, the light emitted from the light emitting element LD may pass through the first color conversion area CCA1 to be converted to the light of the first color, so that the light of the first color may be emitted from the pixel PXL. In addition, in case that the second color conversion area CCA2 overlaps the light emitting element LD as the color wheel CW rotates, the light emitted from the light emitting element LD may pass through the second color conversion area CCA2 to be converted to the light of the second color, so that the light of the second color may be emitted from the pixel PXL. In addition, in case that the third color conversion area CCA3 overlaps the light emitting element LD as the color wheel CW rotates, the light emitted from the light emitting element LD may pass through the third color conversion area CCA3, so that the light of the third color may be emitted from the pixel PXL. In an embodiment, an area of each of the first color conversion area CCA1, the second color conversion area CCA2, and/or the third color conversion area CCA3 may be larger than that of the light emitting element LD.

A first color conversion layer CC1 may be disposed in the first color conversion area CCA1, a second color conversion layer CC2 may be disposed in the second color conversion area CCA2, and a scattering layer LS may be disposed in the third color conversion area CCA3.

In an embodiment, the first color conversion layer CC1 may include a first quantum dot that converts light of the third color (or blue) emitted from the light emitting element LD into light of the first color (or red). The first quantum dot may absorb the third color light to shift a wavelength according to an energy transition to emit the first color light.

In addition, the second color conversion layer CC2 may include a second quantum dot that converts light of the third color (or blue) emitted from the light emitting element LD into light of the second color (or green). The second quantum dot may absorb the third color light to shift a wavelength according to an energy transition to emit the second color light.

In an embodiment, blue light having a relatively short wavelength among the visible ray bands is incident on the first quantum dot and the second quantum dot, respectively, thereby increasing an absorption coefficient of the first quantum dot and the second quantum dot. Accordingly, light efficiency finally emitted from the pixel PXL may be improved, and simultaneously, excellent color reproducibility may be secured. In addition, the light emitting part EMU of the pixel PXL may be configured by using light emitting elements LD of the same color (for example, blue light emitting elements), and the color of the pixel PXL may be realized by using the color wheel CW, so that the manufacturing process of the display device may be simplified.

The scattering layer LS may be provided to efficiently use the third color (or blue color) light emitted from the light emitting element LD. For example, the scattering layer LS may include light scattering particles to efficiently use light emitted from the light emitting element LD. The scattering layer LS may include light scattering particles dispersed in a matrix material such as a base resin. For example, the scattering layer LS may include light scattering particles such as silica, but the constituent materials of the light scattering particles are not limited thereto. The light scattering particles may be included in the first color conversion layer CC1 or the second color conversion layer CC2. In some embodiments, the scattering layer LS may be omitted, or a transparent polymer may be provided instead of the scattering layer LS.

Hereinafter, another embodiment will be described. The same elements as those described above will be referred to by the same reference numerals in embodiments below, and redundant descriptions will be omitted or simplified.

Figure 9:
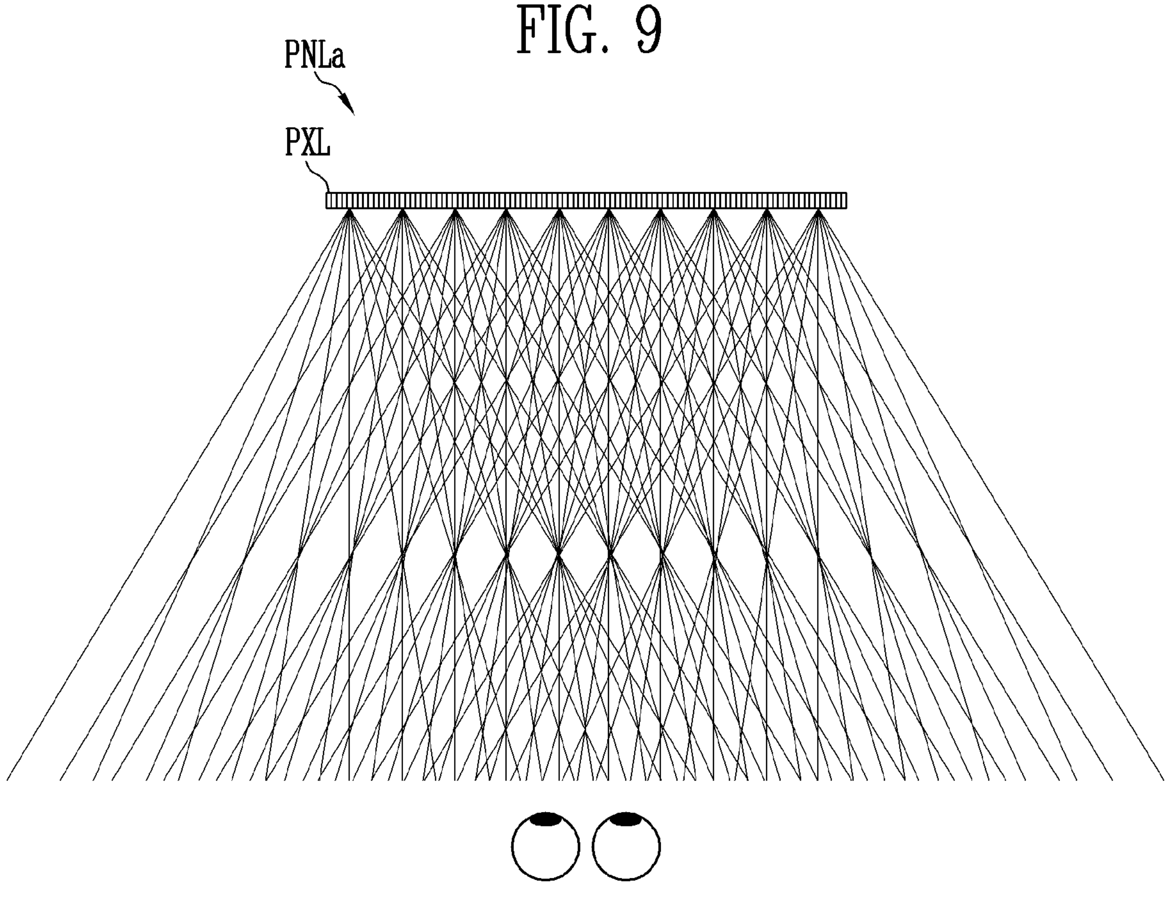
FIG. 9 illustrates a schematic drawing for explaining a display panel according to another embodiment.

FIG. 9 illustrates a schematic drawing for explaining a display panel according to another embodiment. FIG. 9 schematically illustrates a stereoscopic image display panel PNLa.

Referring to FIG. 9, the stereoscopic image display panel PNLa may include pixels PXL that emit light to display an image. The stereoscopic image display panel PNLa may be a light field display device, and may use a flat display panel and an optical element (for example, a micro system) to form a light field expressed as a vector distribution (intensity, direction) of light in space to realize a stereoscopic image (3D image). Since, according to the light field display device, a depth and side surface of an object may be viewed, it may be possible to realize a more natural stereoscopic image, and thus, it may be used in various ways by combination with augmented reality (AR) technology.

In an embodiment, each of the pixels PXL may form a light field by adjusting an angle of the light emitted from the light emitting elements by using a micro system. In case that a viewer views the stereoscopic image display panel PNLa in the light field formed as described above, the viewer may feel a stereoscopic effect of a corresponding image.

Figure 10:
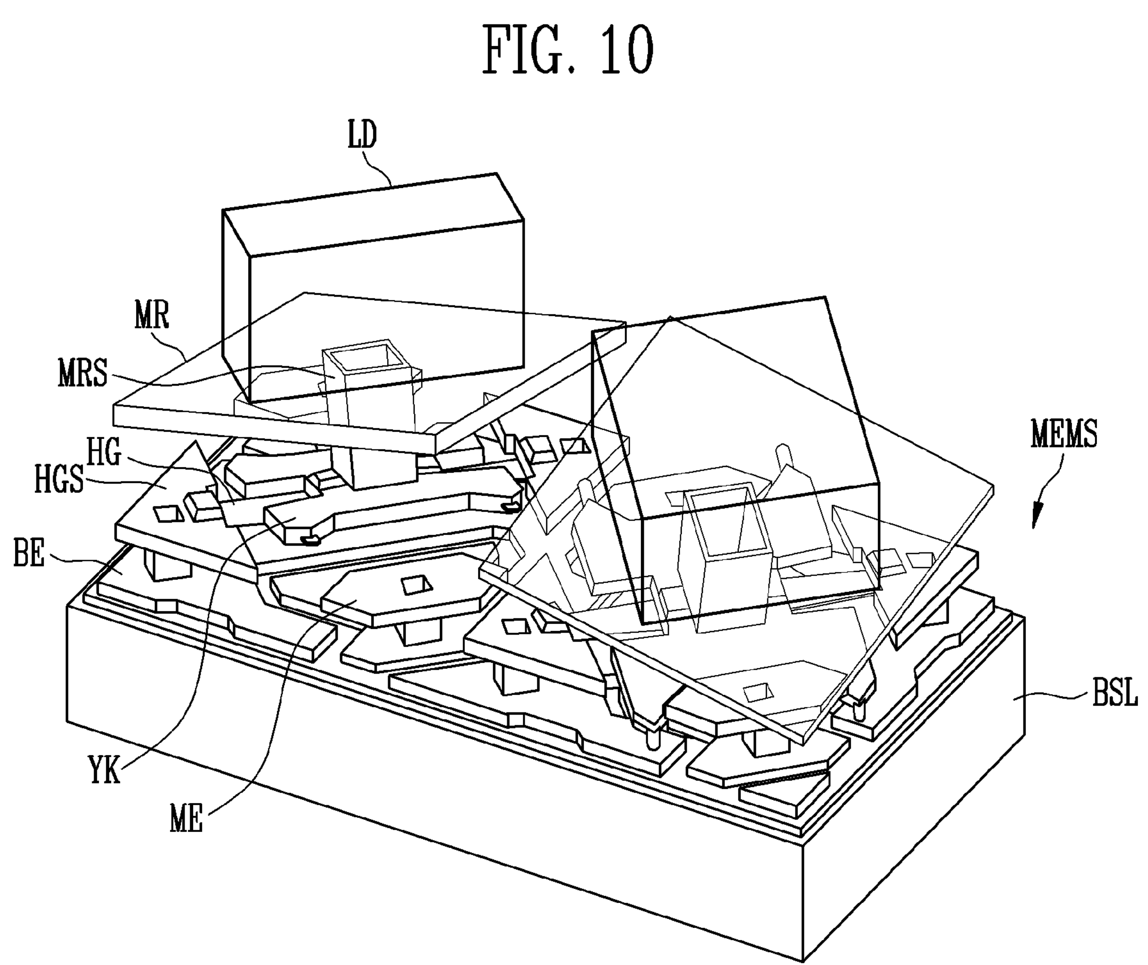
FIG. 10 illustrates a schematic drawing for explaining a micro system included in a pixel according to another embodiment.

FIG. 10 illustrates a schematic drawing for explaining a micro system included in a pixel according to another embodiment. FIG. 11 illustrates a schematic cross-sectional view of the micro system of FIG. 10.

Referring to FIG. 10 and FIG. 11, a micro system MEMS may be a microstructure integrated on the base layer BSL so as to adjust an angle of light emitted from the light emitting elements LD, and may be a digital micromirror device. The micro system MEMS may be a unit element corresponding to a pixel PXL, and may be arranged as many as the resolution number of the stereoscopic image display panel PNLa.

The micro system MEMS may include a bottom electrode BE, a hinge HG, a yoke YK, and/or a mirror MR. The bottom electrode BE may be disposed on the base layer BSL. The bottom electrode BE may be formed as a single layer or multilayer made of molybdenum (Mo), copper (Cu), aluminum (Al), chromium (Cr), gold (Au), silver (Ag), titanium (Ti), nickel (Ni), neodymium (Nd), indium (In), tin (Sn), and a oxide thereof or an alloy thereof, or a combination thereof.

An insulating layer ISL may be disposed on the bottom electrode BE. The insulating layer ISL may include an inorganic material such as a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), a titanium oxide (TiOx), or a combination thereof. In addition, the insulating layer ISL may include an organic material such as an acrylates resin, an epoxy resin, a phenolic resin, a polyamides resin, a polyimides resin, a polyesters resin, a polyphenylenesulfides resin, a benzocyclobutene (BCB), or a combination thereof, but is not necessarily limited thereto.

The hinge HG may be disposed on the insulating layer ISL. The hinge HG may serve to form a light field by adjusting the angle of the mirror MR through rotation to adjust the angle of light emitted from the light emitting element LD coupled to the mirror MR.

A hinge supporter HGS, the yoke YK, and/or a mirror electrode ME may be disposed on the hinge HG. The hinge supporter HGS, the yoke YK, and/or the mirror electrode ME may be disposed on the same layer. For example, the hinge supporter HGS, the yoke YK, and/or the mirror electrode ME may be simultaneously formed on the same conductive layer, but are not limited thereto.

The hinge supporter HGS may serve to support the hinge HG by being coupled to the hinge HG. Hinge supporters HGS may be provided, and may be respectively coupled to a side and another side of the hinge HG, but are not limited thereto. The hinge supporter HGS may be connected to the bottom electrode BE through a contact hole passing through the insulating layer ISL.

The yoke YK may be disposed on the hinge HG to adjust the angle of the mirror MR together with the hinge HG. For example, the yoke YK may serve to be coupled to the hinge HG to control it to be maintained at a specific angle. In some embodiments, the yoke YK may include a separate spring tip and the like, and driving stability of the micro system MEMS may be improved by the yoke YK.

The mirror electrode ME may be electrically connected to the bottom electrode BE. The mirror electrode ME may be electrically connected to the bottom electrode BE through a contact hole passing through the insulating layer ISL.

The mirror MR may be disposed on the hinge HG. The light emitting elements LD may be coupled to a surface of the mirror MR. The detailed description of the light emitting elements LD has been described in detail with reference to FIG. 2 and the like, so duplicate contents will be omitted. As the hinge HG rotates, the mirror MR may rotate at a specific angle to control an emission angle of light emitted from the light emitting elements LD coupled to the mirror MR to form a light field.

The mirror MR may be connected to the hinge HG through the mirror supporter MRS. For example, the mirror supporter MRS may be coupled to the yoke YK, and may be connected to the hinge HG through the yoke YK. The mirror supporter MRS may be provided integrally with the mirror MR. For example, a photo resist may be formed on the hinge supporter HGS, the yoke YK, and/or the mirror electrode ME, and a via hole for exposing the yoke YK may be formed in the photo resist. A mirror layer corresponding to the mirror MR and the mirror supporter MRS is formed. An area of the mirror layer formed on a surface of the photo resist may function as the mirror MR, and an area of the mirror layer formed on the via hole may function as the mirror supporter MRS. In case that the photo resist is removed through plasma etching, the mirror supporter MRS coupled to the yoke YK and the mirror MR integrally provided with the mirror supporter MRS may be finally formed.

Figures 13, 14:
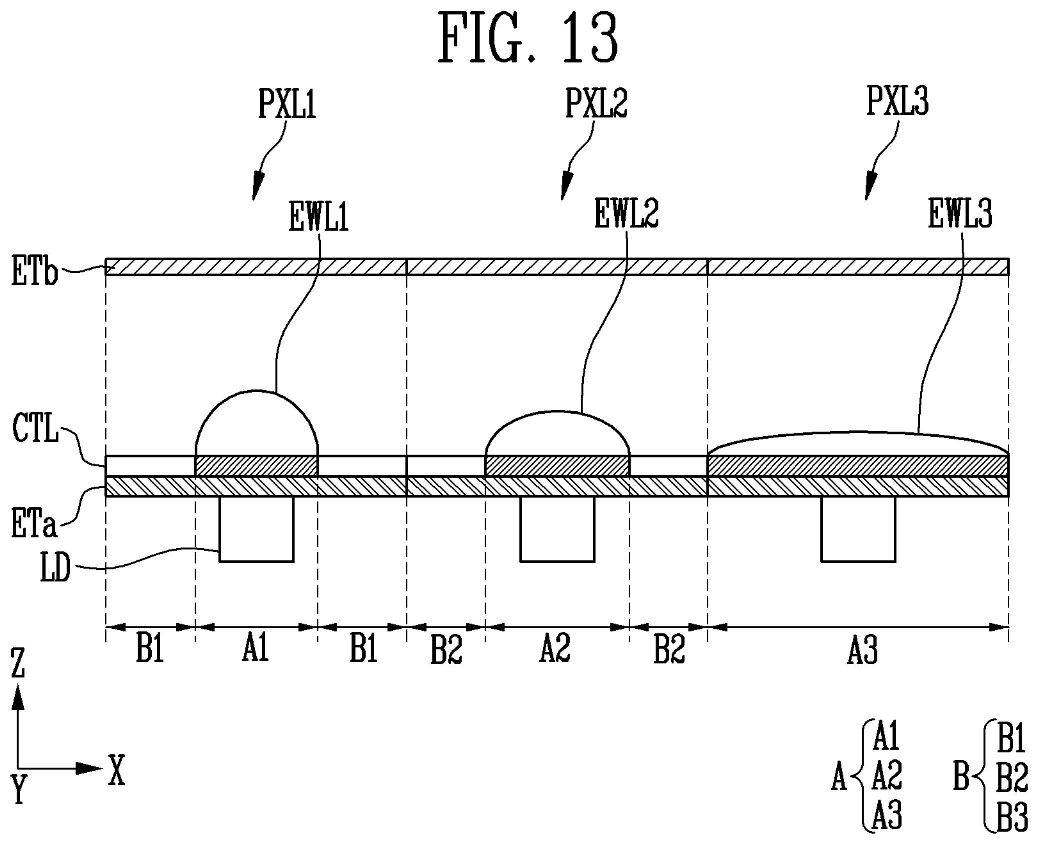
FIG. 13 illustrates schematic cross-sectional views of first to third pixels according to another embodiment.
FIG. 14 illustrates schematic cross-sectional views of first to third pixels according to another embodiment.

FIG. 12 illustrates a schematic cross-sectional view of a pixel according to another embodiment. FIG. 13 illustrates schematic cross-sectional views of first to third pixels according to another embodiment.

Referring to FIG. 12 and FIG. 13, the pixel PXL according to an embodiment may include a coating layer CTL, a first electrode ETa, a second electrode ETb, a light emitting element LD, and/or an electro-wetting lens EWL.

The coating layer CTL may be a dielectric material coated on a surface of the first electrode ETa. The coating layer CTL may include a hydrophobic area (A) and a hydrophilic area (B). The hydrophobic area (A) and the hydrophilic area (B) may be distributed or adjusted according to voltages applied to the first and second electrodes ETa and ETb. For example, positions and sizes of the hydrophobic area (A) and the hydrophilic area (B) may be adjusted according to the voltages applied to the first and second electrodes ETa and ETb. For example, a width of a first direction (X-axis direction) of the hydrophobic area (A) and a width of the first direction (X-axis direction) of the hydrophilic area (B) may be different from each other.

The light emitting elements LD may be disposed on a first surface S1 of the coating layer CTL. The first electrode ETa may be disposed between the first surface S1 of the coating layer CTL and the light emitting element LD.

The electro-wetting lens EWL may be disposed on a second surface S2 of the coating layer CTL. The electro-wetting lens EWL may be disposed between the second surface S2 of the coating layer CTL and the second electrode ETb. The electro-wetting lens EWL may serve to refract light emitted from the light emitting elements LD to form a light field to display a stereoscopic image. The electro-wetting lens EWL is disposed in the hydrophobic area (A) of the coating layer CTL, and a contact angle thereof may be changed according to the voltage applied to the first and second electrodes ETa and ETb. The electro-wetting lens EWL may be disposed to overlap the light emitting elements LD in the third direction (Z-axis direction). The electro-wetting lens EWL may be disposed in the hydrophobic area (A) of the coating layer CTL. As described above, the position and shape of the electro-wetting lens EWL may be controlled by adjusting the position and size of the hydrophobic area (A) and the hydrophilic area (B). For example, as shown in FIG. 13, a portion of each of the first to third pixels PXL1, PXL2, and PXL3 may be formed in a hydrophobic area A1, A2, or A3, and the remaining portion thereof may be formed in a hydrophilic area B1, B2, or B3. In order to explain various embodiments, a case in which the entire third pixel PXL3 is formed in the hydrophobic area A3 is illustrated in the drawing, but the disclosure is not limited thereto, and a portion of the third pixel PXL3 is formed in the hydrophobic area A3, and the remaining portion thereof may be formed in the hydrophilic area B3. By adjusting widths of the hydrophobic areas A1, A2, and A3 and the hydrophilic areas B1, B2, and B3 of the first to third pixels PXL1, PXL2, and PXL3, respectively, shapes of the electro-wetting lens EWL1, EWL2, and EWL3 of the first to third pixels PXL1, PXL2, and PXL3 may be controlled, respectively. Specifically, the widths of the hydrophobic areas A1, A2, and A3 of the first to third pixels PXL1, PXL2, and PXL3 may be different from each other. For example, the widths of the hydrophilic areas B1, B2, and B3 of the first to third pixels PXL1, PXL2, and PXL3 may be different from each other.

The width of the first direction (X-axis direction) of the hydrophobic area A1 of the first pixel PXL1 may be smaller than the width of the first direction (X-axis direction) of the hydrophobic area A2 of the second pixel PXL2. In addition, the width of the first direction (X-axis direction) of the hydrophobic area A2 of the second pixel PXL2 may be smaller than the width of the first direction (X-axis direction) of the hydrophobic area A3 of the third pixel PXL3. For example, the width of the first direction (X-axis direction) of the hydrophilic area B1 of the first pixel PXL1 may be greater than the width of the first direction (X-axis direction) of the hydrophilic area B2 of the second pixel PXL2. In addition, the width of the first direction (X-axis direction) of the hydrophilic area B2 of the second pixel PXL2 may be greater than the width of the first direction (X-axis direction) of the hydrophilic area B3 of the third pixel PXL3.

However, the disclosure is not necessarily limited thereto, and the widths of the hydrophobic areas A1, A2, and A3 and the hydrophilic areas B1, B2, and B3 of the first to third pixels PXL1, PXL2, and PXL3 may be variously changed according to embodiments.

As described above, in case that the widths of the hydrophobic areas A1, A2, and A3 of the first to third pixels PXL1, PXL2, and PXL3 are respectively adjusted, a contact angle between the electrowetting lens EWL1, EWL2, or EWL3 of each of the first to third pixels PXL1, PXL2, and PXL3 and the coating layer CTL may be determined. For example, a contact angle between the electro-wetting lens EWL1 and the coating layer CTL of the first pixel PXL1 may be greater than a contact angle between the electro-wetting lens EWL2 and the coating layer CTL of the second pixel PXL2. In addition, a contact angle between the electro-wetting lens EWL2 and the coating layer CTL of the second pixel PXL2 may be greater than a contact angle between the electro-wetting lens EWL3 and the coating layer CTL of the third pixel PXL3. As described above, by respectively controlling the shapes of the electro-wetting lenses EWL1, EWL2, and EWL3 of the first to third pixels PXL1, PXL2, and PXL3, the light emitted from the light emitting elements LD may be refracted to form a light field to display a stereoscopic image. However, the disclosure is not necessarily limited thereto, and the contact angle between the electrowetting lens EWL1, EWL2, or EWL3 and the coating layer CTL of each of the first to third pixels PXL1, PXL2, and PXL3 may be variously changed according to embodiments.

FIG. 14 illustrates schematic cross-sectional views of first to third pixels according to another embodiment.

Referring to FIG. 14, the first to third pixels PXL1, PXL2, and PXL3 according to an embodiment may be different from those of an embodiment of FIG. 13 in that a first electrode ETa' may include electrode patterns. The electrode patterns of the first electrode ETa' may be at least partially separated from each other to be disposed on a surface of the coating layer CTL. As described above, by adjusting the widths of the hydrophobic areas A1, A2, and A3 and the hydrophilic areas B1, B2, and B3 of the first to third pixels PXL1, PXL2, and PXL3 of the coating layer CTL through the electrode patterns of the first electrode ETa', respectively, shapes of the electro-wetting lens EWL1, EWL2, and EWL3 of the first to third pixels PXL1, PXL2, and PXL3 may be controlled, respectively.

Figure 15:
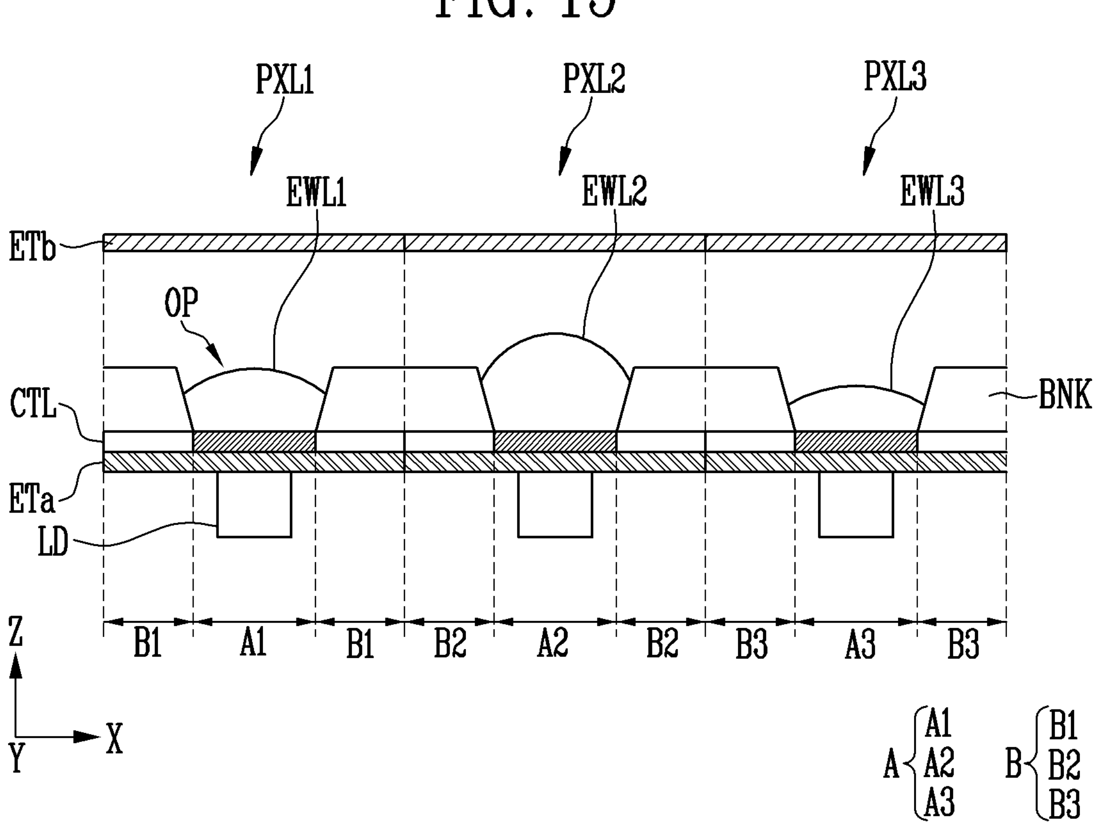
FIG. 15 illustrates schematic cross-sectional views of first to third pixels according to another embodiment.

FIG. 15 illustrates schematic cross-sectional views of first to third pixels according to another embodiment.

Referring to FIG. 15, the first to third pixels PXL1, PXL2, and PXL3 according to an embodiment may be different from those of an embodiment of FIG. 13 in that they further include a bank BNK.

The bank BNK may be entirely disposed at boundaries of the first to third pixels PXL1, PXL2, and PXL3. The bank BNK may include an opening OP that overlaps the hydrophobic areas A1, A2, and A3 of the first to third pixels PXL1, PXL2, and PXL3, respectively. For example, the opening OP of the bank BNK may expose the hydrophobic areas A1, A2, and A3 of the first to third pixels PXL1, PXL2, and PXL3, respectively. In the opening OP of the bank BNK, the electro-wetting lenses EWL1, EWL2, and EWL3 of the first to third pixels PXL1, PXL2, and PXL3, respectively, may be disposed. The electro-wetting lenses EWL1, EWL2, EWL3 of the first to third pixels PXL1, PXL2, and PXL3 may be disposed on the hydrophobic areas A1, A2, and A3 of the first to third pixels PXL1, PXL2, and PXL3 exposed by the opening OP of the bank BNK. As such, in case that the electro-wetting lenses EWL1, EWL2, and EWL3 of the first to third pixels PXL1, PXL2, and PXL3 are provided in the opening OP of the bank BNK, the electro-wetting lenses EWL1, EWL2, and EWL3 may be controlled.

The bank BNK may include an organic material such as an acrylates resin, an epoxy resin, a phenolic resin, a polyamides resin, a polyimides resin, a polyesters resin, a polyphenylenesulfides resin, a benzocyclobutene (BCB), or a combination thereof, but is not necessarily limited thereto.

Hereinafter, an electronic device to which the display device of the above-described embodiments may be applied will be described.

FIG. 16 to FIG. 19 illustrate schematic electronic devices according to various embodiments.

Figure 16:
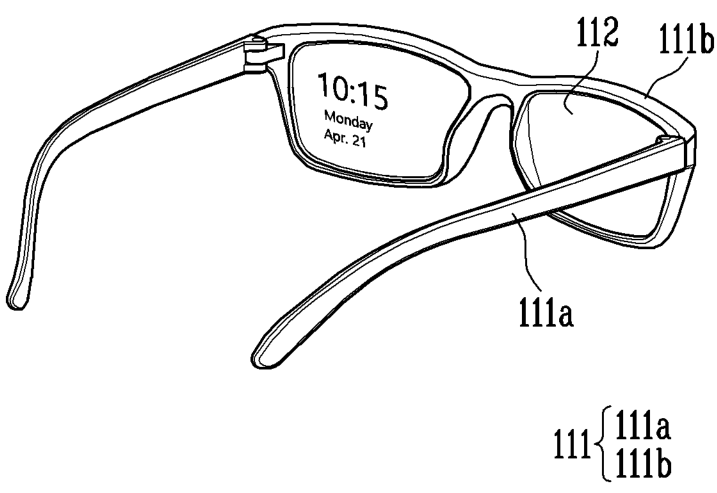
FIG. 16 to FIG. 19 illustrate schematic electronic devices according to various embodiments.

Referring to FIG. 16, the display device according to the above-described embodiments may be applied to smart glasses. The smart glasses may include a frame 111 and a lens part 112. The smart glasses are a wearable electronic device that may be worn on a user's face, and may have a structure in which a portion of the frame 111 is folded or unfolded. For example, the smart glasses may be a wearable device for augmented reality (AR).

The frame 111 may include a housing 111*b* supporting the lens part 112 and a leg part 111*a* for a user to wear. The leg part 111*a* may be coupled to the housing 111*b* by a hinge to be folded or unfolded.

A battery, a touch pad, a microphone, and/or a camera may be embedded in the frame 111. In addition, a projector that outputs light and/or a processor that controls an optical signal and the like may be embedded in the frame 111.

The lens part 112 may be an optical member that transmits light or reflects light. The lens part 112 may include glass and/or a transparent synthetic resin.

The display device according to the above-described embodiments may be applied to the lens part 112. For example, the user may recognize an image displayed by an optical signal transmitted from the projector of the frame 111 through the lens part 112. For example, the user may recognize information such as time and date displayed on the lens part 112.

Figure 17:
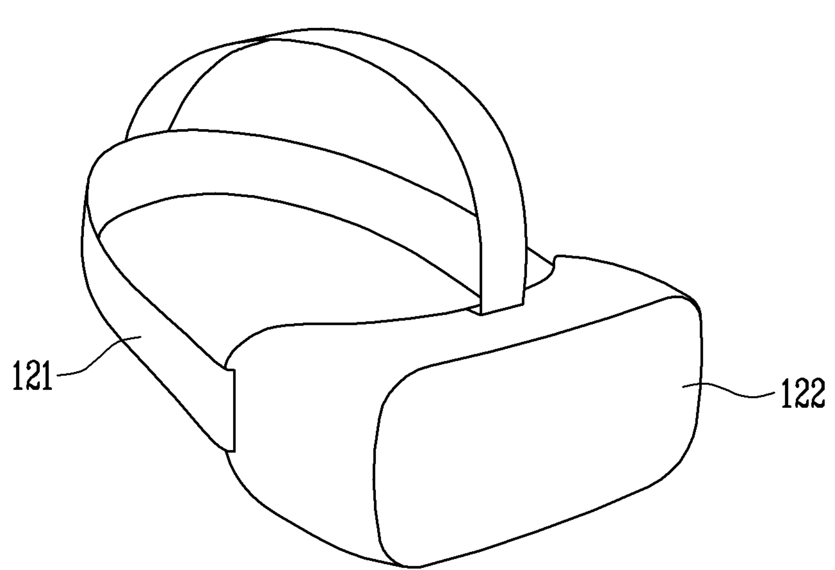

Referring to FIG. 17, the display device according to the above-described embodiments may be applied to a head mounted display (HMD). The head mounted display may include a head mounted band 121 and a display receiving case 122. For example, the head mounted display may be a wearable electronic device that may be worn on a user's head.

The head mounted band 121 may be connected to the display receiving case 122 to fix the display receiving case 122. The head mounted band 121, as shown in FIG. 17, may include a horizontal band and a vertical band for fixing the head mounted display to the user's head, the horizontal band may surround a side portion of the user's head, and the vertical band may surround an upper portion of the user's head. However, the disclosure is not necessarily limited thereto, and the head mounted band 121 may be implemented as an eyeglass frame type of head mounting band 121 or a helmet type of head mounting band 121.

The display receiving case 122 may accommodate the display device, and may include at least one lens. The at least one lens may provide an image to the user. For example, the display device according to the above-described embodiments may be applied to a left eye lens and a right eye lens implemented in the display receiving case 122.

Figure 18:
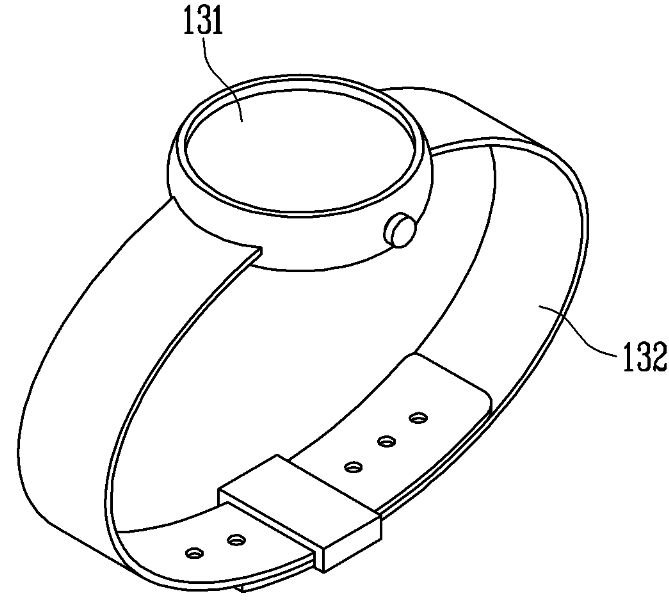

Referring to FIG. 18, the display device according to the above-described embodiments may be applied to a smart watch. The smart watch may include a display part 131 and a strap part 132. The smart watch is a wearable electronic device, and the strap part 132 may be mounted on a user's wrist. The display device according to the above-described embodiments may be applied to the display part 131. For example, the display part 131 may provide image data including information such as time and date.

Figure 19:
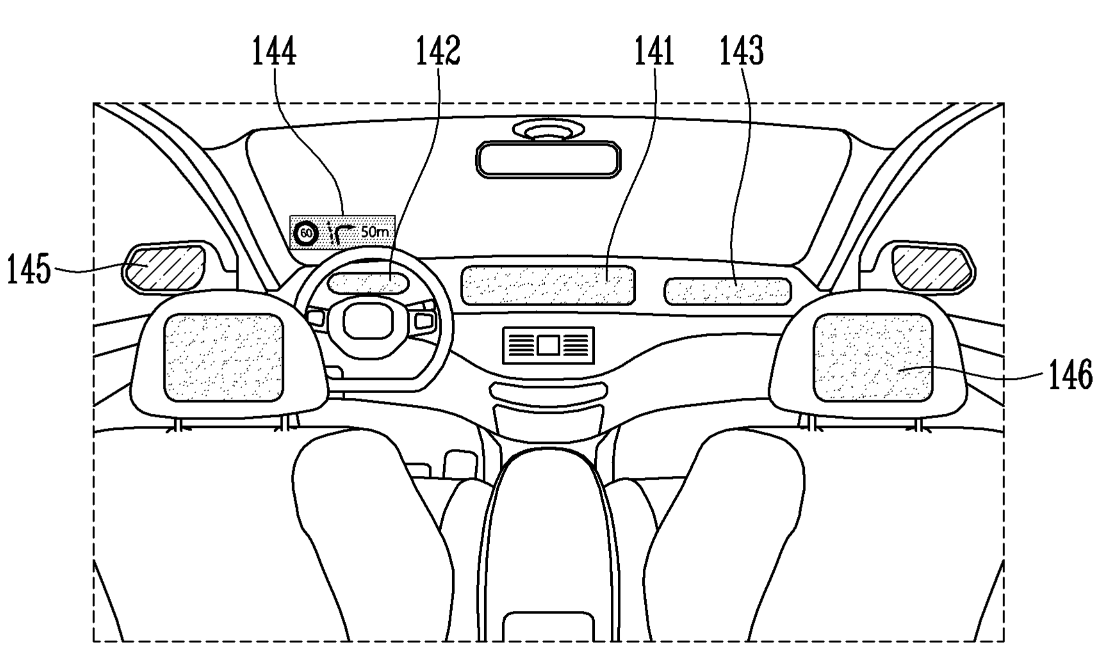

Referring to FIG. 19, the display device according to the above-described embodiments may be applied to an automotive display. For example, the automotive display may mean an electronic device that is provided inside and outside a vehicle to provide image data.

For example, the display device according to the above-described embodiments may be applied to at least one of an infotainment panel 141, a cluster 142, a co-driver display 143, a head-up display 144, a side mirror display 145, and a rear-seat display 146, which may be provided in the vehicle.

Those skilled in the art related to the embodiments will readily appreciate that many modifications are possible without materially departing from the novel teachings and advantages. The embodiments should be considered in a descriptive sense only and not for purposes of limitation. All differences within an equivalent scope should be construed as being included in the scope of the disclosure.

What is claimed is:

1. A display device comprising:

bank patterns disposed on a substrate in a stacking direction;

a light emitting element disposed between the bank patterns on the substrate; and a color wheel disposed on the light emitting element, wherein the light emitting element comprises:

a first semiconductor layer;

a second semiconductor layer; and a first active layer disposed between the first semiconductor layer and the second semiconductor layer, wherein each of the bank patterns comprises:

a third semiconductor layer;

a fourth semiconductor layer; and a second active layer disposed between the third semiconductor layer and the fourth semiconductor layer, wherein the first semiconductor layer and the third semiconductor layer include a same material, the second semiconductor layer and the fourth semiconductor layer include a same material, and the first active layer and the second active layer include a same material, and wherein the fourth semiconductor layer of each of the bank patterns extends farther along the stacking direction away from the substrate than the second semiconductor layer of the light emitting element.

2. The display device of claim 1, wherein the color wheel includes:

a first color conversion area emitting a first color;

a second color conversion area emitting a second color; and a third color conversion area emitting a third color.

3. The display device of claim 2, wherein the color wheel is rotated so that one of the first color conversion area, the second color conversion area, and the third color conversion area overlaps the light emitting element in a plan view.

4. The display device of claim 2, wherein an area of each of the first color conversion area, the second color conversion area, and the third color conversion area is larger than an area of the light emitting element.

5. The display device of claim 1, wherein the color wheel includes a partition, and a color conversion layer disposed in the partition.

6. The display device of claim 1, further comprising:

a wheel rotation axis that drives the color wheel.

7. The display device of claim 1, further comprising:

a reflective layer disposed on side surfaces of the bank patterns.

8. The display device of claim 7, wherein the reflective layer extends in the stacking direction farther than the light emitting element.

9. The display device of claim 7, further comprising an insulating layer between each of the bank patterns and the reflective layer.

10. The display device of claim 7, wherein the reflective layer extends farther along the stacking direction than the light emitting element.

11. The display device of claim 7, wherein the reflective layer and the bank patterns do not overlap along the stacking direction.

12. The display device of claim 9, wherein the insulating layer and the bank patterns do not overlap in the stacking direction.

13. The display device of claim 1, wherein the first semiconductor layer of the light emitting element and the third semiconductor layer of each of the bank patterns have equal thicknesses in the stacking direction.

14. The display device of claim 13, wherein the second active layer of each of the bank patterns and first active layer of the light emitting element have equal thicknesses in the stacking direction.

15. A display device comprising:

bank patterns disposed on a substrate in a stacking direction;

a light emitting element disposed between the bank patterns on the substrate; and a color wheel disposed on the light emitting element, wherein the light emitting element comprises:

a first semiconductor layer;

a second semiconductor layer; and a first active layer disposed between the first semiconductor layer and the second semiconductor layer, wherein each of the bank patterns comprises:

a third semiconductor layer;

a fourth semiconductor layer; and a second active layer disposed between the third semiconductor layer and the fourth semiconductor layer, wherein the light emitting element and the bank patterns include a same material, and wherein each of the bank patterns extends farther along the stacking direction than the light emitting element, wherein the first semiconductor layer of the light emitting element and the third semiconductor layer of each of the bank patterns have equal thicknesses in the stacking direction, wherein the second active layer of each of the bank patterns and first active layer of the light emitting element have equal thicknesses in the stacking direction, and wherein the fourth semiconductor layer of each of the bank patterns has a greater thickness in the stacking direction than the second semiconductor layer of the light emitting element.

16. An electronic device comprising the display device of claim 1.

* * * * *